(12) United States Patent
Shyamsundar

(10) Patent No.: US 12,198,003 B2
(45) Date of Patent: Jan. 14, 2025

(54) NON-BOOLEAN QUANTUM AMPLITUDE AMPIFICATION AND QUANTUM MEAN ESTIMATION SYSTEMS AND METHODS

(71) Applicant: Fermi Research Alliance, LLC, Batavia, IL (US)

(72) Inventor: Prasanth Shyamsundar, Chicago, IL (US)

(73) Assignee: Fermi Research Alliance, LLC, Batavia, IL (US)

( * ) Notice: Subject to any disclaimer, the term of this patent is extended or adjusted under 35 U.S.C. 154(b) by 871 days.

(21) Appl. No.: 17/360,792

(22) Filed: Jun. 28, 2021

(65) Prior Publication Data
US 2022/0414508 A1   Dec. 29, 2022

(51) Int. Cl.
*G06N 10/00* (2022.01)
*G06N 10/20* (2022.01)
(Continued)

(52) U.S. Cl.
CPC ............. *G06N 10/00* (2019.01); *G06N 10/60* (2022.01); *H03K 19/195* (2013.01); *G06N 10/20* (2022.01)

(58) Field of Classification Search
CPC ........ G06N 10/00; G06N 10/20; G06N 10/60; H03K 19/195
See application file for complete search history.

(56) References Cited

U.S. PATENT DOCUMENTS

| | | | |
|---|---|---|---|
| 2019/0019102 A1* | 1/2019 | Babbush | G06N 10/20 |
| 2019/0220497 A1* | 7/2019 | Wiebe | G06F 17/12 |
| 2022/0067567 A1* | 3/2022 | O'Brien | G06N 10/40 |

OTHER PUBLICATIONS

P. Shyamsundar, Non-Boolean quantum amplitude amplification and quantum mean estimation, Quantum Information Processing 22:423 at https://doi.org/10.1007/s11128-023-04146-3, 2023 (Year: 2023).*

(Continued)

*Primary Examiner* — Emily E Larocque
(74) *Attorney, Agent, or Firm* — William A. Harding; Grable Martin PLLC

(57) ABSTRACT

Generalizations of quantum amplitude amplification and amplitude estimation algorithms work with non-boolean oracles (by way of definition, the action of a non-boolean oracle $U_\varphi$ on an eigenstate $|x\rangle$ is to apply a state-dependent phase-shift $\varphi(x)$; unlike boolean oracles, the eigenvalues $\exp(i\varphi(x))$ of a non-boolean oracle are not restricted to be $\pm 1$). The non-boolean amplitude amplification algorithm preferentially amplifies the amplitudes of the eigenstates based on the value of $\varphi(x)$. Starting from a given initial superposition state $|\psi_0\rangle$, the basis states with lower values of $\cos(\varphi)$ are amplified at the expense of the basis states with higher values of $\cos(\varphi)$. The non-boolean quantum mean estimation algorithm uses quantum phase estimation to estimate the expectation $\langle \psi_0 | U_\varphi | \psi_0 \rangle$ (i.e., the expected value of $\exp(i\varphi(x))$ for a random x sampled by making a measurement on $|\psi_0\rangle$). The quantum mean estimation algorithm offers a quadratic speedup over its counterpart boolean algorithm known in the art.

20 Claims, 12 Drawing Sheets

(51) Int. Cl.
G06N 10/60 (2022.01)
H03K 19/195 (2006.01)

(56) References Cited

OTHER PUBLICATIONS

P. Shyamsundar, Non-Boolean Quantum Amplitude Amplification and ML appliations, APS March Meeting 2022 (Year: 2022).*
"Qiskit: An Open-Source Framework for Quantum Computing", Version 0.7.2, Zenodo, Jan. 23, 2019.
Aaronson, Scott, et al., "Quantum Approximate Counting, Simplified", Symposium on Simplicity in Algorithms (SOSA), Aug. 28, 2019, pp. 24-32.
Arrazola, Juan, et al., "Using Gaussian Boson Sampling to Find Dense Subgraphs," Physical Review Letters, vol. 121, Issue 3, Jul. 2018, 6 pages.
Baritompa, W.P., et al., "Grover's Quantum Algorithm Applied to Global Optimization," SIAM Journal on Optimization, vol. 15, No. 4, 2005, pp. 1170-1184.
Benedetti, Marcell, et al., "Parameterized Quantum Circuits as Machine Learning Models," Quantum Science and Technology, vol. 4, Nov. 2019, 18 pages.
Bennett, Charles H., et al., "Strengths and Weaknesses of Quantum Computing," SIAM Journal on Computing, vol. 26, No. 5, 1997, pp. 1510-1523.
Biham, Eliu, et al., "Grover's Quantum Search Algorithm for an Arbitrary Initial Amplitude," Physical Review A, vol. 60, No. 4, 1999, pp. 2742-2745.
Boyer, Gilles, et al., "Tight Bounds on Quantum Searching," Fortschritte der Physik, vol. 46, No. 4-5, May 23, 1996, pp. 493-505.
Brassard, Gilles, et al., "Column—Quantum Cryptanalysis of Hash and Claw-Free Functions", Third Latin American Symp. on Theoretical Informatics (Latin '98), 1998, pp. 163-169.
Brassard, Gilles, et al., "An Exact Quantum Polynomial-Time Algorithm for Simon's Problem," Proceedings of the Fifth Israeli Symposium on Theory of Computing and Systems, Jun. 1997, pp. 12-23.
Brassard, Gilles, et al., "Quantum Amplitude Amplification and Estimation," Quantum Computation and Information (AMS Contemporary Mathematics), vol. 305, 2002, pp. 53-74.
Brassard, Gilles, et al., "Quantum Counting," 25th International Colloquium on Automata, Languages, and Programming, May 27, 1998, pp. 820-831.
Brassard, Gilles, et al., "Quantum Cryptanalysis of Hash and Claw-Free Functions," ACM SIGACT News, vol. 28, Issue 2, Jun. 1997, pp. 14-19.
Brown, Eric, et al., "Quantum Amplitude Estimation in the Presence of Noise," arXiv.org, Jun. 26, 2020, 14 pages.
Buhrman, Harry, et al., "Quantum Fingerprinting," Physical Review Letters, vol. 87, Sep. 26, 2001, 8 pages.
Chabaud, Ulysse, et al., "Optimal Quantum-Programmable Projective Measurement With Linear Optics," Physical Review A, vol. 98, Issue 6, Dec. 2018, (Revised Apr. 2020), 11 pages.
Chakrabarti, Shouvanik, "A Threshold for Quantum Advantage in Derivative Pricing," arXiv.org, 2020, 41 pages.
Chakrabarty, Indranil, et al., "Dynamic Grover Search: Applications in Recommendation Systems and Optimization Problems," Quantum Information Processing, Jun. 2017, 15 pages.
Chen, Yanhu, et al., "An Optimized Quantum Maximum or Minimum Searching Algorithm and Its Circuits," arXiv.org, Aug. 21, 2019, 28 pages.
Cincio, Lukasz, et al., "Learning the Quantum Algorithm for State Overlap," New Journal of Physics, vol. 20, Nov. 2018, 12 pages.
Cleve, Richard, et al., "Quantum Algorithms Revisited," Proceedings of the Royal Society of London. Series A: Mathematical, Physical and Engineering Sciences, 1996, pp. 339-354.
De Beaudrap, J. Niel, "One-Qubit Fingerprinting Schemes," Physical Review A, vol. 69, Feb. 18, 2004, 9 pages.
Dürr, Christoph, et al., "A Quantum Algorithm for Finding the Minimum," Quantum Physics, Jul. 18, 1996, 2 pages.
Fanizza, Marco, et al., "Beyond the Swap Test: Optimal Estimation of Quantum State Overlap," Physical Review Letters, vol. 124, 2020, 6 pages.
Farhi, Edward, et al., "A Quantum Approximate Optimization Algorithm," arXiv.org, 2014, (Revised Jun. 25, 2015), 13 pages.
Farhi, Edward, et al., "Classification with Quantum Neural Networks on Near Term Processors," arXiv.org, 2018, 21 pages.
Farhi, Edward, et al., "Quantum Computation by Adiabatic Evolution," arXiv.org, Jan. 28, 2000, 24 pages.
Farhi, Edward, et al., "Quantum Supremacy through the Quantum Approximate Optimization Algorithm," arXiv.org, 2016 (Revised 2019), 23 pages.
Finnila, A.B., et al., "Quantum Annealing: A New Method for Minimizing Multidimensional Functions," Chemical Physics Letters, vol. 219, Issues 5-6, 1994, pp. 343-348.
Furer, Martin, "Solving NP-Complete Problems with Quantum Search", Third Latin American Symp. on Theoretical Informatics (Latin '08), 2008, pp. 784-792.
Giurgica-Tiron, Tudor, et al., "Low Depth Algorithms for Quantum Amplitude Estimation," airXiv.org, Dec. 8, 2020, 27 pages.
Gong, Changqing, et al., "Quantum K-Means Algorithm Based on Trusted Server in Quantum Cloud Computing," arXiv.org, 2020, 18 pages.
Grant, Edward, et al., "Hierarchical Quantum Classifiers," npj Quantum Information, vol. 4, pp. 1-8.
Grinko, Dmitry, et al., "Iterative Quantum Amplitude Estimation," Quantum Information, vol. 7, Apr. 20, 2021, p. 53, 13 pages.
Grover, Lov K., "A Fast Quantum Mechanical Algorithm for Database Search," Proceedings of the 28th Annual ACM Symposium on Theory of Computing, Association for Computer Machinery, Philadelphia, Pennsylvania, 1996, pp. 212-219.
Grover, Lov K., "Quantum Computers Can Search Rapidly by Using Almost Any Transformation," Physical Review Letters, vol. 80, May 1998, pp. 4329-4332.
Harrow, Aram W., et al., "Testing Product States, Quantum Merlin-Arthur Games and Tensor Optimization,", Journal of the ACM, vol. 60, Issue 1, Feb. 2013, pp. 1-43.
Harrow, Aram, W., et al., "Quantum Algorithm for Linear Systems of Equations," Physical Review Letters, vol. 103, Issue 15, Oct. 2009, 4 pages.
Havlíček, Vojtěch, et al., "Supervised Learning With Quantum-Enhanced Feature Spaces," Nature, vol. 567, 2019, pp. 209-212.
Hogg, Tad, et al., "Quantum Optimization," Information Sciences, vol. 128, Issues 3-4, Oct. 1, 2000, pp. 181-197.
Kadowaki, Tadashi, et al., "Quantum Annealing in the Transverse Ising Model," Physical Review E, vol. 58, Issue 5, Nov. 1998, pp. 5355-5363.
Kumar, Niraj, "Efficient Quantum Communications With Coherent State Fingerprints Over Multiple Channels", Physical Review A 95, Mar. 31, 2017, pp. 032337-1-032337-7.
Lloyd, Seth, et al., "Quantum Algorithms for Supervised and Unsupervised Machine Learning," arXiv.org, Jul. 1, 2013 (revised Nov. 4, 2013), 11 pages.
Mishra, Nimish, et al., "Quantum Machine Learning: A Review and Current Status," Data Management, Analytics and Innovation, 2021, 101-145.
Mitarai, Kosuke, et al., "Quantum Circuit Learning," Physical Review A, vol. 98, Issue 3, Sep. 2018, 6 pages.
Nakaji, Kouhei, "Faster Amplitude Estimation." Quantum Information & Computation, vol. 20, 2020, pp. 1109-1122.
Nayak, Ashwin, "The Quantum Query Complexity of Approximating the Median and Related Statistics," Proceedings of the Thirty-First Annual ACM Symposium on Theory of Computing, May 1999, pp. 384-393.
Peruzzo, Alberto, et al., "A Variational Eigenvalue Solver on a Photonic Quantum Processor," Nature Communications, vol. 5, 2014, 7 pages.
Rebentrost, Patrick, et al., "Quantum Support Vector Machine for Big Data Classification," Physical Review Letters, vol. 113, Sep. 2014, 5 pages.

(56) References Cited

OTHER PUBLICATIONS

Schuld, Maria, et al., "Circuit-Centric Quantum Classifiers," Physical Review A, vol. 101, 2020, 17 pages.
Schuld, Maria, et al., "Evaluating Analytic Gradients on Quantum Hardware," Physical Review A, vol. 99, Issue 3, 2019, 7 pages.
Sun, Guodong, et al., "Quantum Algorithm for Polynomial Root Finding Program," 2014 Tenth International Conference on Computational Intelligence and Security, 2014, pp. 469-473.
Susuki, Yohichi, et al., "Amplitude Estimation Without Phase Estimation," Quantum Information Processing, vol. 19, No. 75, Jan. 2020, 17 pages.
Svore, Krysta M., et al., "Faster Phase Estimation," Quantum Information and Computation, vol. 14, Issue 3-4, Mar. 2014, pp. 306-328.
Toyama, F. M., et al., "Quantum Search with Certainty Based on Modified Grover Algorithms: Optimum Choice of Parameters," Quantum Information Processing, vol. 12, Issue 5, 2013, pp. 1897-1914.
Verdon, Guillaume, et al., "Quantum Graph Neural Networks", arXiv: 1909.12264 [quant-ph], Sep. 26, 2019.
Wang, Guoming, et al., "Bayesian Inference with Engineered Likelihood Functions for Robust Amplitude Estimation", Zapata Computing, Inc., Jun. 17, 2020.
Wang, Yan, "A Quantum Walk Enhanced Grover Search Algorithm for Global Optimization," arXiv.org, Nov. 18, 2017, 15 pages.
Wiebe, Nathan, et al., "Quantum Algorithms for Nearest-Neighbor Methods for Supervised and Unsupervised Learning," Quantum Information & Computation, vol. 15., 2015, pp. 316-356.

\* cited by examiner

Algorithm 1 Non-boolean amplitude amplification algorithm

1: initialize $|\psi\rangle := |\psi_0\rangle$
2: for $k := 1$ to $K$ do
3:   if $k$ is odd then
4:     update $|\psi\rangle := S_{\psi_0} U_\varphi |\psi\rangle$
5:   else
6:     update $|\psi\rangle := S_{\psi_0} U_\varphi^\dagger |\psi\rangle$
7:   end if
8: end for
9: Measure the ancilla in the 0/1 basis.

Algorithm 2 Alternative formulation of the non-boolean amplitude amplification algorithm.

---

1: initialize $|\Psi\rangle := |\Psi_0\rangle$
402, 404  2: for $k := 1$ to $K$ do
430, 432  3:     update $|\Psi\rangle := S_{\Psi_0} U_\varphi [X \otimes I] |\Psi\rangle$
        4: end for
440  5: Measure the ancilla in the 0/1 basis.

NON-BOOLEAN QUANTUM AMPLITUDE AMPIFICATION AND QUANTUM MEAN ESTIMATION SYSTEMS AND METHODS

STATEMENT REGARDING FEDERALLY SPONSORED RESEARCH OR DEVELOPMENT

The invention described in this patent application was made with Government support under the Fermi Research Alliance, LLC, Contract Number DE-AC02-07CH11359 awarded by the U.S. Department of Energy. The Government has certain rights in the invention.

FIELD OF THE INVENTION

The present invention relates generally to quantum computing technology. More particularly, this invention pertains to devices, systems, and associated methods for achieving computational speed increases in quantum algorithms.

BACKGROUND OF THE INVENTION

Grover's algorithm is a quantum search algorithm for finding the unique input $x_{good}$ that satisfies Equation (1), as follows:

$$f_{bool}(x_{good}) = 1, \quad (1)$$

for a given boolean function $f_{bool}: \{0, 1, \ldots, N-1\} \rightarrow \{0,1\}$. Such an input $x_{good}$ satisfying this boolean function is referred to as the "winning" input of $f_{bool}$. Grover's algorithm has also been adapted to work with boolean functions with multiple winning inputs, where the goal is to find any one of the winning inputs.

An important generalization of Grover's algorithm is the amplitude amplification algorithm in which the function $f_{bool}$ is accessed through a boolean quantum oracle $\hat{U}_{f_{bool}}$ that acts on the orthonormal basis states $|0\rangle, \ldots, |N-1\rangle$ as follows (Equation (2)):

$$\hat{U}_{f_{bool}}|x\rangle = \begin{cases} -|x\rangle, & \text{if } f_{bool}(x) = 1, \\ +|x\rangle, & \text{if } f_{bool}(x) = 0. \end{cases} \quad (2)$$

In this way, the oracle marks the winning states by flipping their phase (that is, shifting the phase by $\pi$). Given a superposition state $|\psi_0\rangle$, the goal of the amplitude amplification algorithm is to amplify the amplitudes (in the superposition state) of the winning states. The algorithm accomplishes this iteratively by initializing a quantum system in the state $|\psi_0\rangle$ and performing the operation $S_{\psi_0} \hat{U}_{f_{bool}}$ on the system during each iteration, where $$S_{\psi_0} \equiv 2|\psi_0\rangle\langle\psi_0| - I. \quad (3)$$

As shown in Equation (3), I is the identity operator. Performing a measurement on the system after the iterative amplification process results in one of winning states with high probability. Grover's original algorithm is a special case of the amplitude amplification algorithm, where a) the uniform superposition state $|s\rangle$ given by Equation (4):

$$|s\rangle = \frac{1}{\sqrt{N}} \sum_{x=0}^{N-1} |x\rangle \quad (4)$$

is used as the initial state $|\psi_0\rangle$ of the system, and b) the number of winning inputs is exactly one.

Closely related to the amplitude amplification algorithm is the amplitude estimation algorithm, which combines features from the amplitude amplification algorithm and a quantum phase estimation (QPE) algorithm to estimate the probability that making a measurement on the initial state $|\psi_0\rangle$ will yield a winning input. If the uniform superposition state $|s\rangle$ is used as $|\psi_0\rangle$, the amplitude estimation algorithm can help estimate the number of winning inputs of $f_{bool}$ (Note: This special case is also referred to as the quantum counting algorithm).

The amplitude amplification algorithm and the amplitude estimation algorithm have a wide range of applications and are important primitives that feature as subroutines employed by other quantum algorithms. The amplitude amplification algorithm can be used to find a winning input to $f_{bool}$ with $\mathcal{O}(\sqrt{N})$ queries of the quantum oracle, regardless of whether the number of winning states is a priori known or unknown (Note: The $\mathcal{O}(\sqrt{N})$ and $\mathcal{O}(N)$ scalings for the quantum and classical algorithms, respectively, hold assuming that the number of winning states does not scale with N). This represents a quadratic speedup over classical algorithms, which typically require $\mathcal{O}(N)$ evaluations of the function $f_{bool}$. Similarly, the amplitude estimation algorithm also offers a quadratic speedup over the corresponding classical approaches. The quadratic speedup due to the amplitude amplification algorithm has been shown to be optimal for oracular quantum search algorithms.

A limitation of known amplitude amplification and estimation algorithms is that they work only with boolean oracles, which classify the basis states as good and bad. In situations where one is interested in using these algorithms in the context of a non-boolean function of the input x, a typical approach is to create a boolean oracle from the non-boolean function by using a threshold value of the function as a decision boundary. That is, the winning states are the ones for which the value of the function is, say, less than the chosen threshold value. In this way, the problem at hand may be adapted to work with the standard amplitude amplification and estimation algorithms.

Accordingly, a need exists for a solution to at least one of the aforementioned challenges in increasing the computation speed of widely applicable quantum algorithms. For instance, an established need exists for adaptation of certain primitive quantum algorithms to work directly with non-boolean functions.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

With the above in mind, embodiments of the present invention are related to quantum amplitude amplification and amplitude estimation algorithms to work with non-boolean oracles. By way of definition, the action of a non-boolean oracle $U_\varphi$ on an eigenstate $|x\rangle$ is apply a state-dependent, real-valued phase-shift $\varphi(x)$. Unlike boolean oracles, the eigenvalues $\exp(i\varphi(x))$ of a non-boolean oracle are not restricted to be $\pm 1$.

In one embodiment of the present invention, a non-boolean amplitude amplification algorithm, starting from an initial superposition state $|\psi_0\rangle$, preferentially amplifies the amplitudes of the basis states based on the value of $\cos(\varphi)$. An objective of the algorithm is to preferentially amplify the states with lower values of $\cos(\varphi(x))$. The algorithm is iterative in nature such that, after K iterations, the probability for a measurement of the system to yield x (namely $p_K(x)$) differs from the original probability $p_0(x)$ by a factor that is linear in $\cos(\varphi(x))$. The coefficient $-\lambda_K$ of this linear dependence controls the degree (and direction) of the preferential amplification.

More specifically, embodiments of the present invention (in one or more of method, system, and/or device form) may include the following steps:

(1) Initialize a two-register system in the $|\Psi_0\rangle$ state;
(2) Perform K iterations: During odd iterations, act on an input basis state using a selective phase-flip unitary operator circuit $S_{\Psi_0}$ and a controlled unitary operator circuit $U_\varphi$. During even iterations, act on an input basis state using the selective phase-flip unitary operator circuit $S_{\Psi_0}$ and a controlled inverse unitary operator circuit $U_\varphi^\dagger$; and
(3) After the K iterations, measure the ancilla in the 0/1 basis.

Up to a certain number of iterations, the iterative steps may be designed to amplify the amplitude of the basis states $|0,x\rangle$ and $|1,x\rangle$ with lower values of $\cos(\varphi(x))$. The measurement of the ancilla at the end of the iterations may be performed simply to ensure that the two registers are not entangled in the final state.

In another embodiment of the present invention, a quantum mean estimation algorithm uses QPE as a subroutine in order to estimate the expectation of $U_\varphi$ under $|\psi_0\rangle$ (i.e., $\langle\psi_0|\psi_\varphi|\psi_0\rangle$). The algorithm offers a quadratic speedup over the classical approach of estimating the expectation, as a sample mean over randomly sampled inputs.

More specifically, embodiments of the present invention (in one or more of method, system, and/or device form) may include the following steps:

(1) Perform the QPE algorithm with a) the two-register unitary operator under consideration, and b) the superposition state $|\Psi_0\rangle$ in place of the eigenstate required by the QPE algorithm as input. Let the output of this step, appropriately scaled to be an estimate of the phase angle in the range $[0,2\pi)$, be $\hat{\omega}$.
(2) Return $\cos(\hat{\omega})$ as the estimate for $\cos(\theta)$ (i.e., the real part of $E_{\psi_0}[e^{i\varphi}]$).

These and other objects, features, and advantages of the present invention will become more readily apparent from the attached drawings and the detailed description of the preferred embodiments, which follow.

BRIEF DESCRIPTION OF THE DRAWINGS

The preferred embodiments of the invention will hereinafter be described in conjunction with the appended drawings provided to illustrate and not to limit the invention, where like designations denote like elements, and in which:

FIG. 5 is pseudocode for a non-boolean amplification algorithm according to FIG. 4;

FIG. 8 is a non-boolean amplification algorithm according to FIG. 7;

Like reference numerals refer to like parts throughout the several views of the drawings.

DETAILED DESCRIPTION OF THE INVENTION

Figure 1:
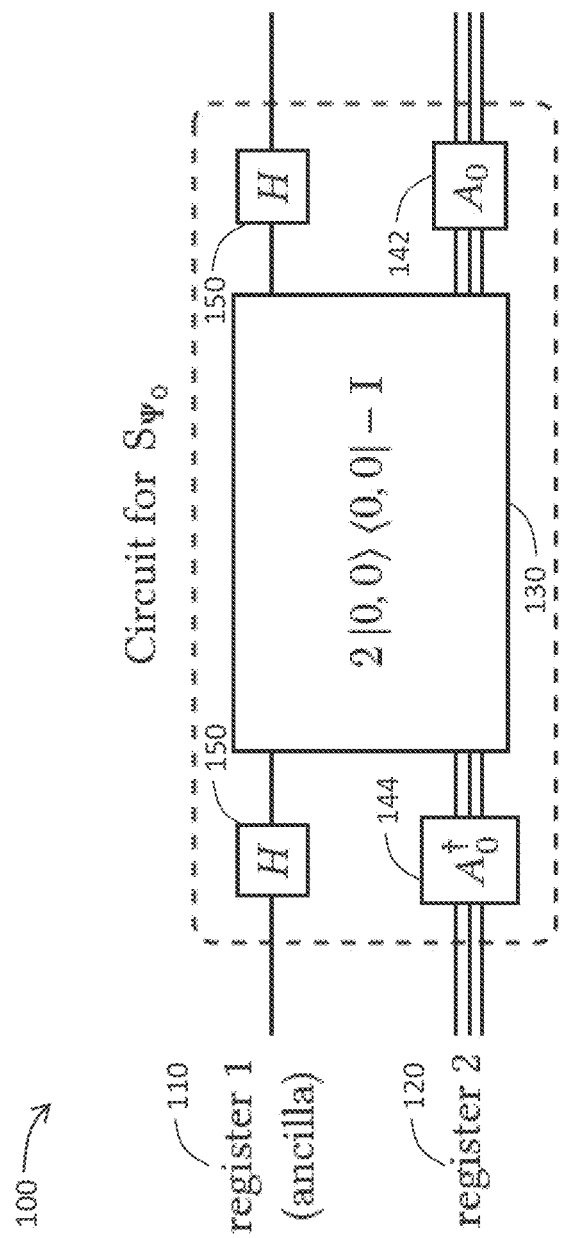
FIG. 1 is a schematic diagram depicting an exemplary quantum circuit implementing a selective phase-flip unitary operator for non-boolean amplitude amplification according to an embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims.

Furthermore, in this detailed description, a person skilled in the art should note that quantitative qualifying terms such as "generally," "substantially," "mostly," and other terms are used, in general, to mean that the referred to object, characteristic, or quality constitutes a majority of the subject of the reference. The meaning of any of these terms is dependent upon the context within which it is used, and the meaning may be expressly modified.

Referring initially to FIGS. 1-9, a non-boolean quantum amplitude amplification algorithm, as also a quantum mean estimation algorithm based in the non-boolean quantum amplitude amplification algorithm, both according to embodiments of the present invention are now described in detail. Throughout this disclosure, the present invention may be referred to as a family of non-boolean quantum amplitude amplification algorithms, a family of non-boolean quantum algorithms, a non-boolean quantum algorithm, a non-boolean quantum method, a non-boolean quantum oracle, a non-boolean quantum system, a method, an oracle, and/or a system. Those skilled in the art will appreciate that this terminology is only illustrative and does not affect the scope of the invention. For instance, the present invention may just as easily relate to an instantiation of an object from a library of non-boolean quantum oracles.

Generally speaking, the present invention is a generalization of amplitude amplification and estimation algorithms to work with quantum oracles for non-boolean functions. Hereinafter, the qualifiers "boolean" and "non-boolean" will be used to distinguish embodiments of the present invention from known boolean versions of the amplitude amplification algorithm and their related applications.

Oracle for a Non-Boolean Function:

The behavior of the boolean quantum oracle $\hat{U}_{f_{bool}}$ of Equation (2) may be generalized to non-boolean functions by allowing the oracle to perform arbitrary phase-shifts on the different basis states. More concretely, let $\varphi: \{0, 1, \ldots, N-1\} \to \mathbb{R}$ be a real-valued function, and let $U_\varphi$ be a quantum oracle given by Equation (5), as follows:

$$U_\varphi \equiv \sum_{x=0}^{N-1} e^{i\varphi(x)}|x\rangle\langle x|. \tag{5}$$

The actions of the oracle $U_\varphi$ and its inverse $U_\varphi^\dagger$ on the basis states $|0\rangle, \ldots, |N-1\rangle$ may be given by Equations (6) and (7), as follows:

$$U_\varphi|x\rangle = e^{+i\varphi(x)}|x\rangle = [\cos(\varphi(x)) + i \sin(\varphi(x))]|x\rangle, \tag{6}$$

$$U_\varphi^\dagger|x\rangle = e^{-i\varphi(x)}|x\rangle = [\cos(\varphi(x)) - i \sin(\varphi(x))]|x\rangle. \tag{7}$$

Goal of the Non-Boolean Amplitude Amplification Algorithm:

Given an oracle $U_\varphi$ and an initial state $|\psi_0\rangle$, a goal of the non-boolean amplitude amplification algorithm of the present invention may be to preferentially amplify the amplitudes of the basis states $|x\rangle$ with lower values of $\cos(\varphi(x))$, at the expense of the amplitude of states with higher values of $\cos(\varphi(x))$. Depending on the context in which the algorithm is to be used, a different function of interest $f$ (which is intended to guide the amplification) may be appropriately mapped onto the function cp. For example, and without limitation, if the range of $f$ is $[0,1]$ and one intends to amplify the states with higher values of $f$, then options for formulating the problem in terms of co include the following:

$$\varphi(x) = \pi f(x) \text{ or } \varphi(x) = \arccos(1-2f(x)). \tag{8}$$

In both cases of Equations (8), $\cos(\varphi)$ is monotonically decreasing in $f$.

The connection between the boolean and non-boolean amplitude amplification algorithms may be seen as follows:

If either of the two options in Equations (8) is used to map a boolean function $f_{bool}$ onto $\varphi_{bool}$, then $$\varphi_{bool}(x) = \begin{cases} \pi, & \text{if } f_{bool}(x) = 1, \\ 0, & \text{if } f_{bool}(x) = 0. \end{cases} \tag{9}$$

In the case of Equation (9), the oracle $U_\varphi$ and its inverse $U_\varphi^\dagger$ both reduce to a boolean oracle as follows (Equation 10):

$$U_{\varphi_{bool}} = U_{\varphi_{bool}}^\dagger = \hat{U}_{f_{bool}}. \tag{10}$$

Congruently, the task of amplifying (the amplitude of) the states with lower values of $\cos(\varphi)$ may align with the task of amplifying the winning states $|x\rangle$ with $f_{bool}(x)=1$.

Goal of the Quantum Mean Estimation Algorithm:

Given a generic unitary operator U and a state $|\psi_0\rangle$, a goal of the quantum mean estimation algorithm may be to estimate the quantity of Equation (11):

$$\langle \psi_0|U|\psi_0\rangle. \tag{11}$$

The task of estimating the quantity of Equation (11) may be phrased in terms of the oracle $U_\varphi$, as estimating the expectation of the eigenvalue $e^{i\varphi(x)}$ for a state $|x\rangle$ chosen randomly by making a measurement on the superposition state $|\psi_0\rangle$. The connection between the two tasks may be seen in Equation (12), as follows:

$$\langle\psi_0|U_\varphi|\psi_0\rangle = \sum_{x=0}^{N-1} \langle\psi_0|e^{i\varphi(x)}|x\rangle\langle x|\psi_0\rangle = \sum_{x=0}^{N-1} |\langle x|\psi_0\rangle|^2 e^{i\varphi(x)}, \tag{12}$$

wherein $|\langle x|\psi_0\rangle|^2$ is the probability for a measurement on $|\psi_0\rangle$ to yield x.

The only difference between (a) estimating $\langle \psi_0|U_\varphi|\psi_0\rangle$ for an oracle $U_\varphi$, and (b) estimating $\langle \psi_0|U|\psi_0\rangle$ for a generic unitary operator U is that $\{|\psi_0|U_\varphi|\psi_0\rangle, \ldots, |N-1\rangle\}$ is known beforehand to be an eigenbasis of $U_\varphi$. On the other hand, the eigenstates of a generic unitary operator U may be a priori unknown. However, as described in detail hereinbelow, the mean estimation algorithm does not use the knowledge of the eigenstates and, therefore, may be applicable for generic unitary operators U as well.

As described hereinabove, the mean estimation algorithm of the present invention is a generalization of known boolean amplitude estimation algorithm(s). Regarding the connection between the respective tasks of these algorithms, note that the eigenvalues of a boolean oracle may be either +1 or −1, and the expectation of the eigenvalue under $|\psi_0\rangle$ is directly related to the probability of a measurement yielding a winning state with eigenvalue −1. This probability is precisely the quantity estimated by the non-boolean amplitude estimation algorithm of the present invention.

Non-Boolean Amplitude Amplification Algorithm:

Setup and Notation: Various embodiments of a non-boolean amplitude amplification algorithm as described herein may include not only a quantum system, or qubit(s), as input to a quantum oracle, but also may employ one extra ancilla qubit. For example, and without limitation, let a quantum system used in certain embodiments of the present algorithm comprise two quantum registers. The first register may contain the lone ancilla qubit, and the second register (input qubit) may be acted upon by the quantum oracle.

The notations $|a\rangle \otimes |b\rangle$ and $|a,b\rangle$ may both refer to a state where the two registers are unentangled, with the first register in state $|a\rangle$ and the second register in state $|b\rangle$. The tensor product notation $\otimes$ may also be used to combine operators that act on the individual registers into operators that simultaneously act on both registers. Such two-register operators may be represented by boldface symbols (e.g., $\mathbf{S}_{\Psi_0}$, $\mathbf{U}_\varphi$, $\mathbf{I}$). Likewise, boldface symbols may be used to represent the states of the two-register system in the bra-ket notation (e.g., $|\Psi_0\rangle$). As used herein, any state written in the bra-ket notation (e.g., $|\psi\rangle$) will be unit normalized (i.e., normalized to 1). The dagger notation (†) may be used to denote the Hermitian conjugate of an operator, which is also the inverse for a unitary operator.

Unless otherwise specified herein, $\{|0\rangle, |1\rangle, \ldots, |N-1\rangle\}$ may be used as the basis for (that is, as the state space of) the second register. Any measurement of the second register may refer to measurement in this basis. Likewise, unless otherwise specified, $$\{|0,0\rangle, |0,1\rangle, \ldots, |0,N-1\rangle\} \cup \{|1,0\rangle, |1,1\rangle, \ldots, |1,N-1\rangle\} \tag{13}$$

may be used as the basis for the two-register system.

In Equation (14) below, let $|\psi_0\rangle$ be the initial state of the second register from which the amplification process is to begin, and let $A_0$ be the unitary operator that changes the state of the second register from $|0\rangle$ to $|\psi_0\rangle$ (Note: Assumed here, only for notational convenience, is that there exists a state $|0\rangle$ which is simultaneously an eigenstate of $U_\varphi$, as well as a special, easy-to-prepare state of the second register; a person of skill in the art will immediately recognize the algorithms described herein may be modified to work even without this assumption):

$$|\psi_0\rangle \equiv A_0|0\rangle \equiv \sum_{x=0}^{N-1} a_0(x)|x\rangle, \tag{14}$$

such that $$\sum_{x=0}^{N-1} |a_0(x)|^2 = 1,$$

where $a_0(x)$ is the initial amplitude of the basis state $|x\rangle$.

The algorithm introduced hereinbelow may initialize the ancilla (i.e., first register) in the $|+\rangle$ state given by Equation (15), as follows:

$$|+\rangle = \frac{|0\rangle + |1\rangle}{\sqrt{2}}. \tag{15}$$

Anticipating this initialization, let the two-register state $|\Psi_0\rangle$ be defined as in Equation (16), as follows:

$$|\Psi_0\rangle \equiv |+,\psi_0\rangle = \frac{|0,\psi_0\rangle + |1,\psi_0\rangle}{\sqrt{2}} \tag{16}$$

$$= \frac{1}{\sqrt{2}} \sum_{x=0}^{N-1} a_0(x)[|0,x\rangle + |1,x\rangle]$$

Required Unitary Operations: The following unitary operations may be used in certain embodiments of a generalized amplitude amplification algorithm of the present invention:

Selective Phase-Flip Operator. Let the two-register unitary operator $\mathbf{S}_{\Psi_0}$ be defined as in Equation (17):

$$\mathbf{S}_{\Psi_0} \equiv 2|\Psi_0\rangle\langle\Psi_0| - \mathbf{I} \tag{17}$$
$$= 2|+,\psi_0\rangle\langle+,\psi_0| - \mathbf{I},$$

where $\mathbf{I}$ is the two-register identity operator. $\mathbf{S}_{\Psi_0}$ may leave the state $|\Psi_0\rangle$ unchanged and may flip the phase of any state orthogonal to $|\Psi_0\rangle$. $\mathbf{S}_{\Psi_0}$ may be the two-register generalization of $S_{\psi_0}$ used in counterpart boolean amplitude amplification algorithm(s). From Equations (14) and (16), it follows (in Equation (18)) that $$|\Psi_0\rangle = [H \otimes A_0]|0,0\rangle, \tag{18}$$

where $H$ is the Hadamard transform. Thus, $\mathbf{S}_{\Psi_0}$ may be expressed as in Equation (19):

$$\mathbf{S}_{\Psi_0} = [H \otimes A_0][2|0,0\rangle\langle 0,0| - \mathbf{I}][H \otimes A_0^\dagger]. \tag{19}$$

Referring initially to FIG. 1, an exemplary quantum circuit 100 implementing non-boolean amplitude amplification according to an embodiment of the present invention will now be described in detail. A quantum system of circuit 100 may comprise a first register (ancilla qubit) 110 and a second register (input qubit) 120. The second register 120 may be configured to be acted upon by a quantum oracle 130. As illustrated, Equation (19) is used to drive an implementation of circuit 130 for $\mathbf{S}_{\Psi_0}$, provided one has access to the quantum circuits that implement $A_0$ (unitary operator 142) and $A_0^\dagger$ (inverse unitary operator 144). Hadamard transforms 150 are denoted as H.

Conditional Oracle Calls: Let the two-register unitary operator $\mathbf{U}$ be defined as in Equation (20):

$$\mathbf{U}_\varphi = |0\rangle\langle 0| \otimes U_\varphi + |1\rangle\langle 1| \otimes U_\varphi^\dagger. \tag{20}$$

This operator's action on the basis states of the two-register system is given by Equations (21) and (22):

$$\mathbf{U}_\varphi|0,x\rangle = e^{+i\varphi(x)}|0,x\rangle, \tag{21}$$

$$\mathbf{U}_\varphi|1,x\rangle = e^{-i\varphi(x)}|1,x\rangle. \tag{22}$$

If the ancilla is in state $|0\rangle$, $\mathbf{U}_\varphi$ acts $U_\varphi$ on the second register. On the other hand, if the ancilla is in state $|1\rangle$, $\mathbf{U}_\varphi$ acts $U_\varphi^\dagger$ on the second register. The inverse of $\mathbf{U}_\varphi$ is given by Equation (23):

$$\mathbf{U}_\varphi^\dagger = |0\rangle\langle 0| \otimes U_\varphi^\dagger + |1\rangle\langle 1| \otimes U_\varphi, \tag{23}$$

and the action of $\mathbf{U}_\varphi^\dagger$ on the basis states is given by Equations (24) and (25):

$$\mathbf{U}_\varphi^\dagger|0,x\rangle = e^{-i\varphi(x)}|0,x\rangle, \tag{24}$$

$$\mathbf{U}_\varphi^\dagger|1,x\rangle = e^{+i\varphi(x)}|1,x\rangle. \tag{25}$$

The amplitude amplification algorithm for non-boolean functions may involve calls to both $\mathbf{U}_\varphi$ and $\mathbf{U}_\varphi^\dagger$.

Figure 2:
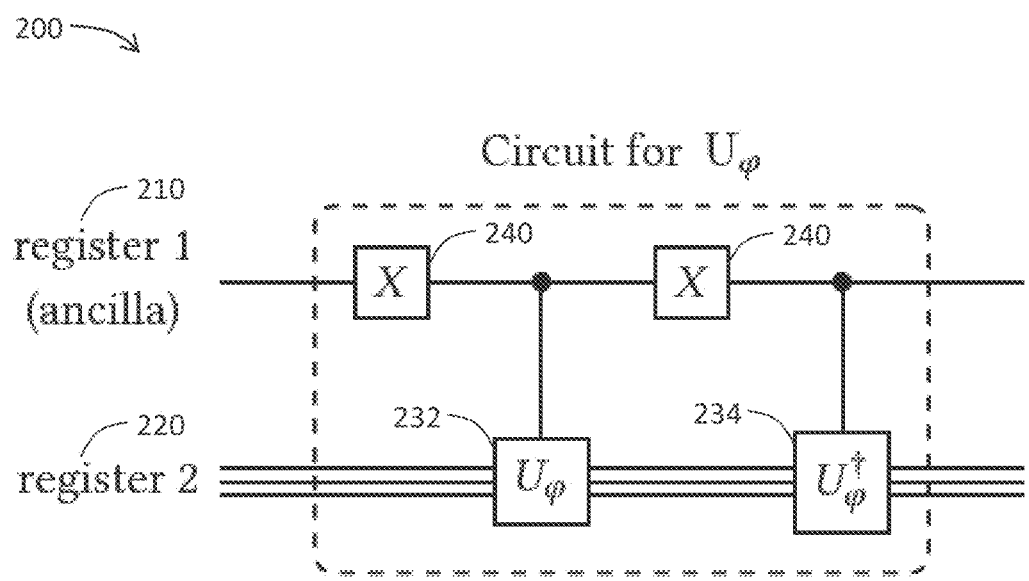
FIG. 2 is a schematic diagram depicting an exemplary quantum circuit implementing a first conditional oracle call unitary operator for a non-boolean amplitude amplification algorithm according to an embodiment of the present invention.
Figure 3:
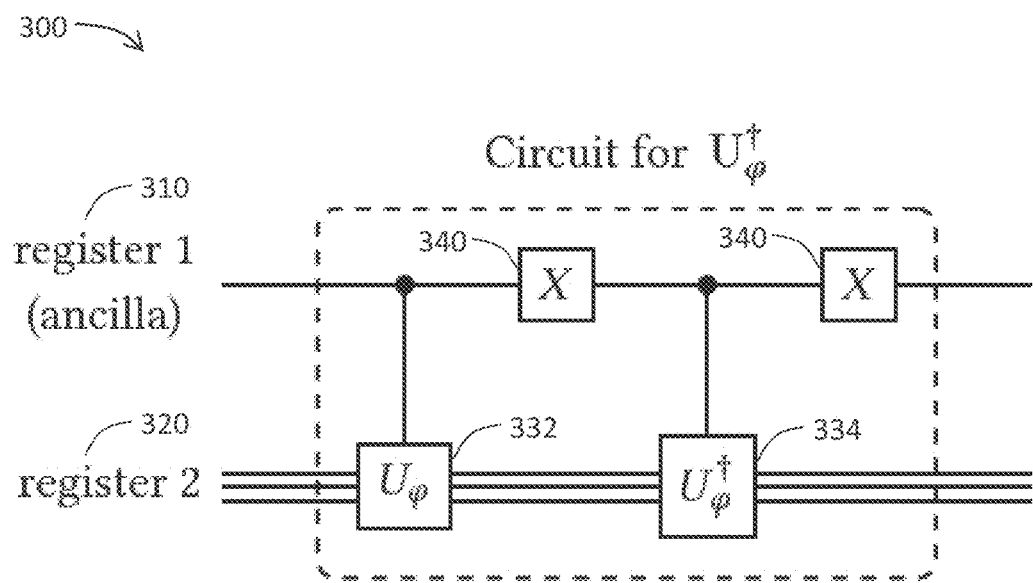
FIG. 3 is a schematic diagram depicting an exemplary quantum circuit implementing a second conditional oracle call unitary operator for a non-boolean amplitude amplification algorithm according to an embodiment of the present invention.

Referring now to FIGS. 2 and 3, exemplary quantum circuits 200 and 300 each implementing non-boolean amplitude amplification according to an embodiment of the present invention will now be described in detail. FIG. 2 depicts a circuit implementation 200 of $\mathbf{U}_\varphi$ using a) ancilla 210 serving as a control qubit, b) bit-flip (or Pauli-X) gates 240 denoted as X, and c) second register 220 acted upon by controlled $U_\varphi$ and $U_\varphi^\dagger$ operations (i.e., oracles) 232, 234, respectively. FIG. 3 depicts a circuit implementation 330 of $\mathbf{U}_\varphi^\dagger$ using a) ancilla 310 serving as a control qubit, b) bit-flip (or Pauli-X) gates 340 denoted as X, and c) second register 320 acted upon by controlled $U_\varphi$ and $U_\varphi^\dagger$ operations 332, 334, respectively.

Figure 4:
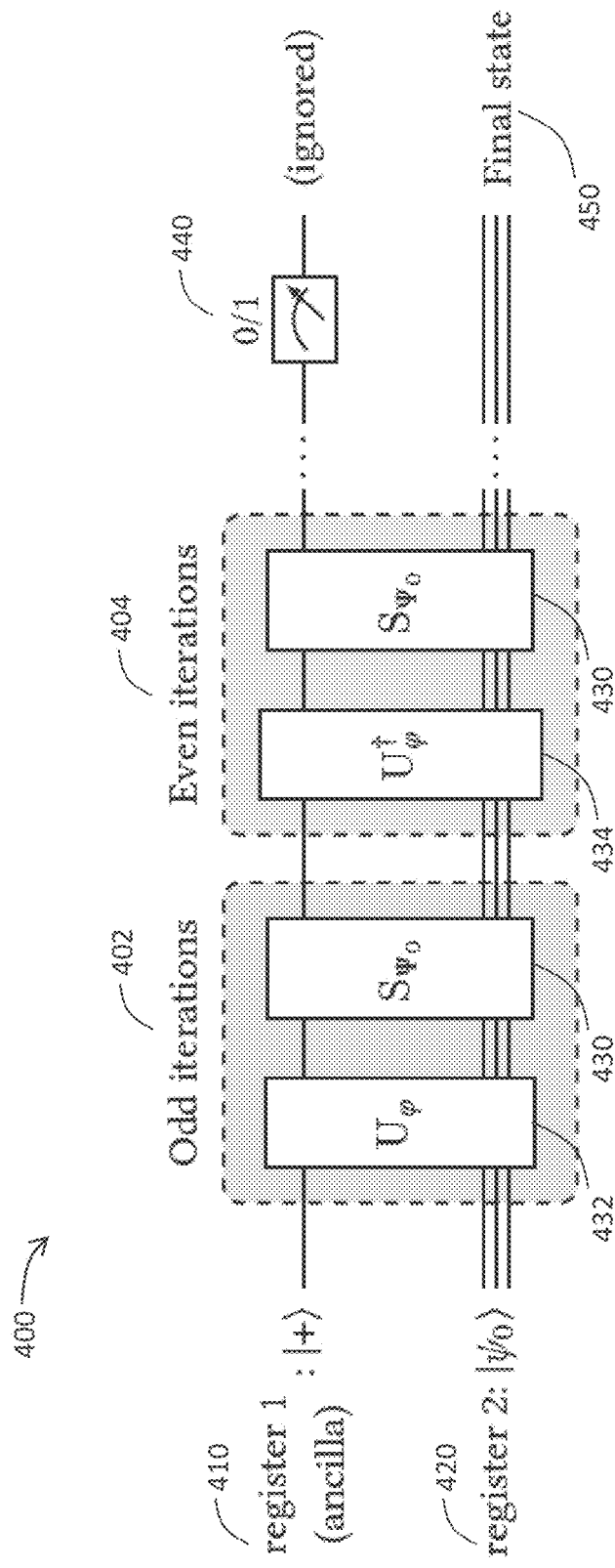
FIG. 4 is schematic diagram depicting a quantum circuit for a first exemplary non-boolean amplification algorithm according to an embodiment of the present invention.

Algorithm Description:

Referring now to FIGS. 4 and 5, an exemplary quantum circuit 400 and pseudocode 500 implementing a non-boolean amplitude amplification quantum algorithm according to an embodiment of the present invention will now be described in detail. For example, and without limitation, the amplitude amplification algorithm for non-boolean functions is iterative and may comprise the following steps:

(1) Initialize a two-register system in the $|\Psi_0\rangle$ state;
(2) Perform K iterations: During odd iterations 402, apply operations 430, 432 denoted $S_{\Psi_0} U_\varphi$ on the system. During even iterations 404, apply operations 430, 434 denoted $S_{\Psi_0} U_\varphi^\dagger$ on the system; and
(3) After the K iterations, measure 440 the ancilla (first register 410) in the 0/1 basis.

Up to a certain number of iterations, the iterative steps 402, 404 may be designed to amplify the amplitude of the basis states $|0,x\rangle$ and $|1,x\rangle$ with lower values of $\cos(\varphi(x))$. The measurement 440 of the ancilla 410 at the end of the algorithm may be performed simply to ensure that the two registers 410, 420 are not entangled in the final state 450 of the system. The specification of K (i.e., the number of iterations to perform) is included in an analysis of the present algorithm described hereinbelow.

Connection to Known Boolean Amplitude Amplification Algorithm:

From Equations (20) and (23), a person of skill in the art will immediately recognize that for the boolean oracle case given by $\varphi(x)=\pi f_{bool}(x)$, $U_\varphi$ and $U_\varphi^\dagger$ both reduce to $I \otimes \hat{U}_{f_{bool}}$, where $\hat{U}_{f_{bool}}$ is the oracle used in known boolean amplitude amplification algorithm(s). Furthermore, if a first register is in the $|+\rangle$ state, from Equations (3) and (17), the action of $S_{\Psi_0}$ is given by Equation (26):

$$S_{\Psi_0}[|+\rangle \otimes |\psi\rangle] = |+\rangle \otimes [S_{\Psi_0}|\psi\rangle]. \quad (26)$$

Note that the first register is unaffected here. Thus, for the boolean oracle case, the algorithm 400, 500 of FIGS. 4 and 5 may reduce to simply acting $S_{\psi_0} \hat{U}_{f_{bool}}$ on the second register 420 during each iteration 402, 404; the ancilla qubit 410 remains untouched and unentangled from the second register 420. In this way, algorithm 400, 500 is a generalization of known boolean amplitude amplification algorithm(s) described hereinabove.

The two key differences of the generalized algorithm from the boolean algorithm, apart from the usage of a non-boolean oracle, may be as follows:

(1) The addition of the ancilla 410, which doubles the dimension of the state space of the system, and
(2) Alternating between using $U_\varphi$ and $U_\varphi^\dagger$ (operations 432 and 434, respectively) during the odd iterations 402 and even iterations 404.

Analysis of the Non-Boolean Amplitude Amplification Algorithm:

Still referring to FIGS. 4 and 5, let $|\Psi_k\rangle$ be the state of the two-register system after $k=0, 1, \ldots, K$ iterations of the amplitude amplification algorithm 400 (but before the measurement 440 of the ancilla 410). For $k>0$, $|\Psi_k\rangle$ may be recursively written as in Equation (27):

$$|\Psi_k\rangle \equiv \begin{cases} S_{\Psi_0} U_\varphi |\Psi_{k-1}\rangle, & \text{if } k \text{ is odd}, \\ S_{\Psi_0} U_\varphi^\dagger |\Psi_{k-1}\rangle, & \text{if } k \text{ is even} \end{cases}. \quad (27)$$

Let $\tilde{a}_k(0,x)$ and $\tilde{a}_k(1,x)$ be the normalized amplitudes of the basis states $|0,x\rangle$ and $|1,x\rangle$, respectively, in the superposition $|\Psi_k\rangle$.

$$|\Psi_k\rangle \equiv \sum_{x=0}^{N} [\tilde{a}_k(0,x)|0,x\rangle + \tilde{a}_k(1,x)|1,x\rangle]. \quad (28)$$

In the initial state $|\Psi_0\rangle$, the amplitudes $\tilde{a}_0(0,x)$ and $\tilde{a}_0(1,x)$ are both given, from Equation (16), by the following (Equation (29)):

$$\tilde{a}_0(0,x) = \tilde{a}_0(1,x) = \frac{a_0(x)}{\sqrt{2}}. \quad (29)$$

Let the parameter $\theta \in [0,\pi]$ be implicitly defined by Equation (30):

$$\cos(\theta) \equiv \sum_{x=0}^{N-1} |a_0(x)|^2 \cos(\varphi(x)). \quad (30)$$

$\cos(\theta)$ is the expected value of $\cos(\varphi(x))$ over bitstrings x sampled by measuring the state $|\psi_0\rangle$.

Let the two-register states $|\alpha\rangle$ and $|\beta\rangle$ be defined as follows (Equations (31) and (32)):

$$|\alpha\rangle = U_\varphi |\Psi_0\rangle, \quad (31)$$

$$|\beta\rangle = U_\varphi^\dagger |\Psi_0\rangle. \quad (32)$$

These register states may be used to track the evolution of the system through the iterative steps 402, 404 of algorithm 400, 500. Using Equations (16), (20), and (23), $|\alpha\rangle$ and $|0\rangle$ may be written as follows (Equations (33) and (34)):

$$|\alpha\rangle = \frac{1}{\sqrt{2}} \sum_{x=0}^{N-1} a_0(x) \left[ e^{i\varphi(x)} |0,x\rangle + e^{-i\varphi(x)} |1,x\rangle \right], \quad (33)$$

$$|\beta\rangle = \frac{1}{\sqrt{2}} \sum_{x=0}^{N-1} a_0(x) \left[ e^{-i\varphi(x)} |0,x\rangle + e^{i\varphi(x)} |1,x\rangle \right]. \quad (34)$$

Note that $\theta$, $|\alpha\rangle$, and $|\beta\rangle$ are all implicitly dependent on the function $\varphi$ and the initial state $|\psi_0\rangle$. For notational convenience, these dependencies are not explicitly indicated.

The First Iteration:

After one iterative step, the system may be in state $|\Psi_1\rangle$ given by Equation (35):

$$|\Psi_1\rangle = S_{\Psi_0} U_\varphi |\Psi_0\rangle. \quad (35)$$

Using Equations (17) and (31), this state may be written as follows (Equation (36)):

$$|\Psi_1\rangle = S_{\Psi_0} |\alpha\rangle = 2 \langle \Psi_0 | \alpha \rangle |\Psi_0\rangle - |\alpha\rangle. \quad (36)$$

From Equations (16), (30), and (33), it follows that $$\begin{aligned}
\langle \Psi_0 | \alpha \rangle &= \frac{1}{2} \sum_{x=0}^{N-1} |a_0(x)|^2 \left[ e^{i\varphi(x)} \langle 0,x|0,x\rangle + e^{-i\varphi(x)} \langle 1,x|1,x\rangle \right] \\
&= \frac{1}{2} \sum_{x=0}^{N-1} |a_0(x)|^2 \left[ e^{i\varphi(x)} + e^{-i\varphi(x)} \right] \\
&= \frac{1}{2} \sum_{x=0}^{N-1} |a_0(x)|^2 2\cos(\varphi(x)) = \cos(\theta)
\end{aligned} \quad (37)$$

Note from Equation (37) that $\langle \Psi_0 | \alpha \rangle$ is real-valued. Key to the functioning of the algorithm 400, 500, the motivation behind adding an ancilla qubit 410 (effectively doubling the number of basis states) is precisely to make $\langle \Psi_0 | \alpha \rangle$ real-valued.

From Equations (36) and (37), $|\Psi_1\rangle$ may be written as follows (Equation (38)):

$$|\Psi_1\rangle = 2\cos(\theta)|\Psi_0\rangle - |\alpha\rangle. \tag{38}$$

From Equations (16) and (33), the amplitude $\tilde{a}_1(0,x)$ of the basis state $|0,x\rangle$ in the superposition $|\Psi_1\rangle$ may be written as follows (Equation (39)):

$$\tilde{a}_1(0, x) = \langle 0, x|\Psi_1\rangle = \frac{a_0(x)}{\sqrt{2}}\left[2\cos(\theta) - e^{i\varphi(x)}\right]. \tag{39}$$

Likewise, the amplitude $\tilde{a}_1(1,x)$ of the basis state $|1,x\rangle$ may be written as follows (Equation (40)):

$$\tilde{a}_1(1, x) = \langle 1, x|\Psi_1\rangle = \frac{a_0(x)}{\sqrt{2}}\left[2\cos(\theta) - e^{-i\varphi(x)}\right]. \tag{40}$$

Equations (39) and (40) show that, after one iterative step, the amplitudes of $|0,x\rangle$ and $|1,x\rangle$ have acquired factors of $[2\cos(\theta) - e^{i\varphi(x)}]$ and $[2\cos(\theta) - e^{-i\varphi(x)}]$, respectively. Now, Equation (41) shows that, if $\cos(\theta)$ is positive, the magnitude of the "amplitude amplification factor" after one iteration is monotonically decreasing in $\cos(\varphi)$:

$$\frac{|\tilde{a}_1(0,x)|^2}{|\tilde{a}_0(0,x)|^2} = \frac{|\tilde{a}_1(1,x)|^2}{|\tilde{a}_0(1,x)|^2} = 4\cos^2(\theta) + 1 - 4\cos(\theta)\cos(\varphi(x)). \tag{41}$$

Such preferential amplification of states with lower values of $\cos(\varphi)$ is precisely what the algorithm 400, 500 set out to do.

Note that this monotonicity property relies on $\rangle\Psi_0 |\alpha\rangle$ being real valued in Equation (36). If $\langle\Psi_0|\alpha\rangle$ is complex, with a phase $\delta \notin \{0,\pi\}$, then the amplification will be monotonic in $\cos(\varphi-\delta)$, which does not meet the present goal of the algorithm 400, 500. The case where $\rangle\Psi_0|\alpha\rangle$ is not real-valued is explored further hereinbelow.

Identities to Track the Subsequent Iterations:

Equations (16), (17), (20), (23), (31), and (32) may be used to derive the identities of Equations (42), which capture the actions of the operators $S_{\Psi_0}$, $U_\varphi$, and $U_\varphi^\dagger$ on the states IW0), $|\alpha\rangle$, and $|\beta\rangle$:

$$S_{\Psi_0}|\Psi_0\rangle = |\Psi_0\rangle, \tag{42}$$

$$S_{\Psi_0}|\alpha\rangle = 2\cos(\theta)|\Psi_0\rangle - |\alpha\rangle,$$

$$S_{\Psi_0}|\beta\rangle = 2\cos(\theta)|\Psi_0\rangle - |\beta\rangle,$$

$$U_\varphi|\Psi_0\rangle = |\alpha\rangle,$$

$$U_\varphi|\alpha\rangle = \frac{1}{\sqrt{2}}\sum_{x=0}^{N-1} a_0(x)\left[e^{2i\varphi(x)}|0, x\rangle + e^{-2i\varphi(x)}|1, x\rangle\right],$$

$$U_\varphi|\beta\rangle = |\Psi_0\rangle,$$

$$U_\varphi^\dagger|\Psi_0\rangle = |\beta\rangle,$$

$$U_\varphi^\dagger|\alpha\rangle = |\Psi_0\rangle,$$

$$U_\varphi^\dagger|\beta\rangle = \frac{1}{\sqrt{2}}\sum_{x=0}^{N-1} a_0(x)\left[e^{-2i\varphi(x)}|0, x\rangle + e^{2i\varphi(x)}|1, x\rangle\right].$$

A person of skill in the art will immediately recognize that the subspace spanned by the states $|\Psi_0\rangle$, $|\alpha\rangle$, and $|\beta\rangle$ is almost stable under the action of $S_{\Psi_0}$, $U_\varphi$, and $U_\varphi^\dagger$. Only the actions of $U_\varphi$ on $|\alpha\rangle$ and $|\beta\rangle$ may take the state of the system out of this subspace. Continuing to refer to FIGS. 4 and 5, the motivation behind alternating between using $U_\varphi$ and $U_\varphi^\dagger$ during the odd iterations 402 and the even iterations 404 is to keep the state of the system within the subspace spanned by $|\Psi_0\rangle$, $|\alpha\rangle$, and $|\beta\rangle$.

From the identities above, the expressions of Equations (43) may be written capturing the relevant actions of the odd iteration operator 430, 432 denoted $S_{\Psi_0} U_\varphi$ and the even iteration operator 430, 434 denoted $S_{\Psi_0} U_\varphi^\dagger$:

$$S_{\Psi_0}U_\varphi|\Psi_0\rangle = 2\cos(\theta)|\Psi_0\rangle - |\alpha\rangle,$$

$$S_{\Psi_0}U_\varphi|\beta\rangle = |\Psi_0\rangle,$$

$$S_{\Psi_0}U_\varphi^\dagger|\Psi_0\rangle = 2\cos(\theta)|\Psi_0\rangle - |\beta\rangle,$$

$$S_{\Psi_0}U_\varphi^\dagger|\alpha\rangle = |\Psi_0\rangle. \tag{43}$$

Figure 6:
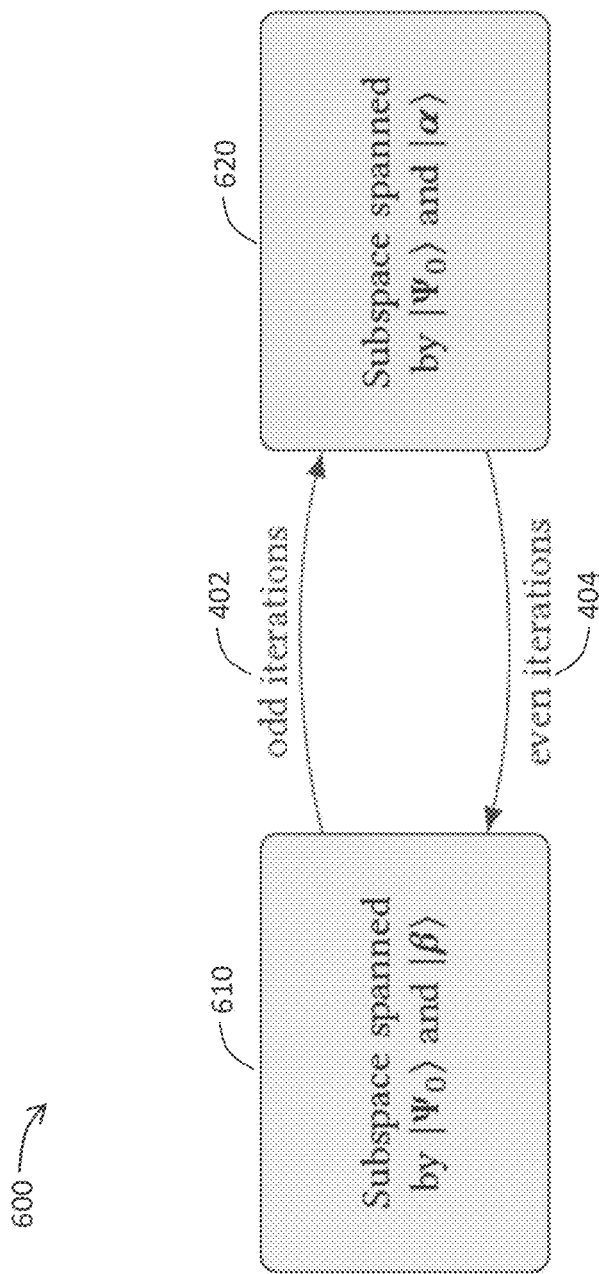
FIG. 6 is a state diagram depicting stage evolution of a two-register system through iterations of the non-boolean amplitude amplification algorithm of FIG. 5.

Referring now to FIG. 6, and continuing to refer to FIGS. 4 and 5, state diagram 600 illustrates how, from the expressions of Equation (43), the odd iteration operator 430, 432 denoted $S_{\Psi_0} U_\varphi$ may map any (first) state 610 in the space spanned by $|\Psi_0\rangle$ and $|\beta\rangle$ to a (second) state 620 in the space spanned by $|\Psi_0\rangle$ and $|\alpha\rangle$. Conversely, the even iteration operator 430, 434 denoted $S_{\Psi_0} U_\varphi^\dagger$ may map any state 620 in the space spanned by $|\Psi_0\rangle$ and $|\alpha\rangle$ to a state 610 in the space spanned by $|\Psi_0\rangle$ and $|\beta\rangle$. Because the algorithm 400, 500 begins with the system initialized in the state $|\Psi_0\rangle$, the state of the system may oscillate between the two subspaces 610, 620 during the odd and even iterations 402, 404.

State After k Iterations:

Using Equations (27) and (43), the state $|\Psi_k\rangle$ of the two-register system after $k \geq 0$ iterations may be written, in matrix multiplication notation, as shown in Equation (44):

$$|\Psi_k\rangle = \begin{cases} [|\Psi_0\rangle|\alpha\rangle]\begin{bmatrix} 2\cos(\theta) & 1 \\ -1 & 0 \end{bmatrix}^k \begin{bmatrix} 1 \\ 0 \end{bmatrix}, & \text{if } k \text{ is odd,} \\ [|\Psi_0\rangle|\beta\rangle]\begin{bmatrix} 2\cos(\theta) & 1 \\ -1 & 0 \end{bmatrix}^k \begin{bmatrix} 1 \\ 0 \end{bmatrix}, & \text{if } k \text{ is even} \end{cases} \tag{44}$$

To simplify Equation (44), let the matrix $M_\theta$ be defined as follows (Equation (45)):

$$M_\theta \equiv \begin{bmatrix} 2\cos(\theta) & 1 \\ -1 & 0 \end{bmatrix}. \tag{45}$$

Substituting Equation (45) into Equation (44) yields Equation (46), as follows:

$$|\Psi_k\rangle = \begin{cases} \begin{bmatrix} |\Psi_0\rangle \\ |\alpha\rangle \end{bmatrix}^T M_\theta^k \begin{bmatrix} 1 \\ 0 \end{bmatrix}, & \text{if } k \text{ is odd,} \\ \begin{bmatrix} |\Psi_0\rangle \\ |\beta\rangle \end{bmatrix}^T M_\theta^k \begin{bmatrix} 1 \\ 0 \end{bmatrix}, & \text{if } k \text{ is even} \end{cases} \tag{46}$$

where the superscript T denotes transposition. $M_\theta$ may be diagonalized as $$M_\theta = S_\theta \begin{bmatrix} e^{-i\theta} & 0 \\ 0 & e^{i\theta} \end{bmatrix} S_\theta^{-1}, \tag{47}$$

and where the matrix $S_\theta$ and its inverse $S_\theta^{-1}$ may be given by $$S_\theta = \frac{-i}{2\sin(\theta)}\begin{bmatrix} e^{-i\theta} & e^{i\theta} \\ -1 & -1 \end{bmatrix}, \quad S_\theta^{-1} = \begin{bmatrix} -1 & -e^{i\theta} \\ 1 & e^{-i\theta} \end{bmatrix}. \quad (48)$$

Now, $M_\theta^k$ may be written as follows (Equation (49)):

$$M_\theta^k = S_\theta \begin{bmatrix} e^{-i\theta} & 0 \\ 0 & e^{i\theta} \end{bmatrix}^k S_\theta^{-1} = S_\theta \begin{bmatrix} e^{-ik\theta} & 0 \\ 0 & e^{ik\theta} \end{bmatrix} S_\theta^{-1}. \quad (49)$$

From Equation (48) and Equation (49), it follows that $$M_\theta^k \begin{bmatrix} 1 \\ 0 \end{bmatrix} = S_\theta \begin{bmatrix} e^{-ik\theta} & 0 \\ 0 & e^{ik\theta} \end{bmatrix} \begin{bmatrix} -1 \\ 1 \end{bmatrix} \quad (50)$$
$$= S_\theta \begin{bmatrix} -e^{-ik\theta} \\ e^{ik\theta} \end{bmatrix} = \frac{1}{\sin(\theta)} \begin{bmatrix} \sin((k+1)\theta) \\ -\sin(k\theta) \end{bmatrix}.$$

Plugging (50) back into (46) leads to the following (Equation (51)):

$$|\Psi_k\rangle = \begin{cases} \frac{1}{\sin(\theta)}[\sin((k+1)\theta)|\Psi_0\rangle - \sin(k\theta)|\alpha\rangle], & \text{if } k \text{ is odd,} \\ \frac{1}{\sin(\theta)}[\sin((k+1)\theta)|\Psi_0\rangle - \sin(k\theta)|\beta\rangle], & \text{if } k \text{ is even.} \end{cases} \quad (51)$$

Basis State Amplitudes after k Iterations:

From Equations (16), (33), (34), and (51), the amplitudes $\tilde{a}_k(0,x)$ of the basis states $|0,x\rangle$ after $k \geq 0$ iterations may be written as follows (Equation (52)):

$$\tilde{a}_k(0, x) = \quad (52)$$
$$\langle 0, x|\Psi_k\rangle = \begin{cases} \frac{a_0(x)}{\sqrt{2}\sin(\theta)}[\sin((k+1)\theta) - \sin(k\theta)e^{i\varphi(x)}], & \text{if } k \text{ is odd,} \\ \frac{a_0(x)}{\sqrt{2}\sin(\theta)}[\sin((k+1)\theta) - \sin(k\theta)e^{-i\varphi(x)}], & \text{if } k \text{ is even.} \end{cases}$$

Similarly, the amplitudes $\tilde{a}_k(1,x)$ of the basis states $|1,x\rangle$ may be written as follows (Equation (53)):

$$\tilde{a}_k(1, x) = \quad (53)$$
$$\langle 1, x|\Psi_k\rangle = \begin{cases} \frac{a_0(x)}{\sqrt{2}\sin(\theta)}[\sin((k+1)\theta) - \sin(k\theta)e^{i\varphi(x)}], & \text{if } k \text{ is odd,} \\ \frac{a_0(x)}{\sqrt{2}\sin(\theta)}[\sin((k+1)\theta) - \sin(k\theta)e^{-i\varphi(x)}], & \text{if } k \text{ is even.} \end{cases}$$

These expressions may be summarized, for $b \in \{0,1\}$, as follows (Equation (54)):

$$\tilde{a}_k(b, x) = \quad (54)$$
$$\begin{cases} \frac{a_0(x)}{\sqrt{2}\sin(\theta)}[\sin((k+1)\theta) - \sin(k\theta)e^{i\varphi(x)}], & \text{if } k+b \text{ is odd,} \\ \frac{a_0(x)}{\sqrt{2}\sin(\theta)}[\sin((k+1)\theta) - \sin(k\theta)e^{-i\varphi(x)}], & \text{if } k+b \text{ is even.} \end{cases}$$

Amplitudes After Ancilla Measurement. Note that the magnitudes of the amplitudes of the states $|0,x\rangle$ and $|1,x\rangle$ are equal; that is, $$|\tilde{a}_1(0,x)| = |\tilde{a}_k(1,x)|, \quad (55)$$

for all $k \geq 0$ and $x \in \{0, 1, \ldots, N-1\}$. Therefore, a measurement 440 of the ancilla qubit in the first register 410 after K iterations may yield a value of either 0 or 1 with equal probability. Let $|\psi_{K,b}\rangle$ be the normalized state of the second register 420 after performing K iterations, followed by a measurement 440 of the ancilla qubit 410, which may yield a value $b \in \{0,1\}$. $|\psi_{K,b}\rangle$ may be written as follows (Equation (56)):

$$|\psi_{K,b}\rangle = \sum_{x=0}^{N-1} a_{K,b}(x)|x\rangle, \quad (56)$$

where $a_{K,b}(x)$ are the normalized amplitudes of the basis states of the second register 420 (after performing K iterations and the measurement 440 of the ancilla 410). $a_{K,b}(x)$ may simply be given by Equation (57):

$$a_{K,b}(x) = \sqrt{2}\tilde{a}_K(b,x). \quad (57)$$

Much of the definition hereinbelow holds a) regardless of whether a measurement 440 is performed on the ancilla qubit 410 after the K iterations, and b) regardless of the value yielded by the ancilla measurement 440 (if performed). The primary goal of measuring 440 the ancilla 410 is to make the two registers 410, 420 unentangled from each other.

Basis State Probabilities After K Iterations:

Continuing to refer to FIGS. 4 and 5, let $p_K(x)$ be the probability for a measurement of the second register after $K \geq 0$ iterations to yield x. This probability may be written, in terms of the amplitudes in the "Basis State Amplitudes After K Iterations" section hereinabove, as follows (Equation (58)):

$$p_K(x) = [|\tilde{a}_K(0,x)|^2 + |\tilde{a}_K(1,x)|^2] = |a_{K,0}(x)|^2 = |a_{K,1}(x)|^2. \quad (58)$$

This expression shows that the probability $p_K(x)$ depends neither on whether the ancilla was measured, nor on the result of the ancilla measurement (if performed). From Equation (54), $p_K(x)$ may be written as follows (Equation (59)):

$$p_K(x) = \frac{p_0(x)}{\sin^2(\theta)}|\sin((K+1)\theta) - \sin(K\theta)e^{i\varphi(x)}|^2$$
$$= \frac{p_0(x)}{\sin^2(\theta)}[\sin^2(K\theta) + \sin^2((K+1)\theta) - 2\sin(K\theta)\sin((K+1)\theta)\cos(\varphi(x))].$$
(59)

A person of skill in the art will immediately recognize that the probability amplification factor $p_K(x)/p_0(x)$ is monotonic in $\cos(\varphi(x))$ for all $K \geq 0$. The following trigonometric identities (Equation (60)) help elucidate the K dependence of this amplification factor:

$$\sin^2(C) + \sin^2(C+D) = \sin^2(D) + 2\sin(C)\sin(C+D)\cos(D),$$

$$2\sin(C)\sin(C+D) = \cos(D) - \cos(2C+D). \quad (60)$$

Setting $C = K\theta$ and $D = \theta$, these identities may be used to rewrite Equation (59) as follows (Equation (61)):

$$p_K(x) = p_0(x)\{1 - \lambda_K[\cos(\varphi(x)) - \cos(\theta)]\}, \quad (61)$$

where the K-dependent factor $\lambda_K$ is given by Equation (62):

$$\lambda_K \equiv \frac{2\sin(K\theta)\sin((K+1)\theta)}{\sin^2(\theta)} = \frac{\cos(\theta) - \cos((2K+1)\theta)}{\sin^2(\theta)}. \quad (62)$$

For notational convenience, the fact that $\lambda_K$ depends on $\theta$ is not explicitly indicated. The result in Equation (61) may be summarized as follows:

(1) Applying K iterations of the non-boolean amplitude amplification algorithm changes the probability of measuring x by a factor that is a linear function of $\cos(\varphi(x))$. If the second register is initially in an equiprobable state (i.e., if $p_0(x) = $ constant), then the probability $p_K(x)$ after K iterations is itself a linear function of $\cos(\varphi(x))$.

(2) If $\cos(\varphi(x)) = \cos(\theta)$ for some x, the probability of a measurement of the second register yielding that x is unaffected by the algorithm.

(3) The slope of the linear dependence is $-\lambda_K$. If $\lambda_K$ is positive, the states with $\cos(\varphi) < \cos(\theta)$ are amplified. Conversely, if $\lambda_K$ is negative, states with $\cos(\varphi) > \cos(\theta)$ are amplified. The magnitude of $\lambda_K$ controls the degree to which the preferential amplification has been performed.

From Equation (62), $\lambda_K$ is an oscillatory function of K, centered around $\cos(\theta)/\sin^2(\theta)$ with an amplitude of $1/\sin^2(\theta)$ and a period of $\pi/\theta$. Recalling from Equation (30) that $$\sum_{x=0}^{N-1} p_0(x)\cos(\varphi(x)) = \cos(\theta) = \sum_{x=0}^{N-1} p_0(x)\cos(\theta), \quad (63)$$

one can verify that for any $K \geq 0$, the probabilities $p_K(x)$ from Equation (61) add up to 1.

From the definition of $\lambda_K$ in Equation (62), for all K, $\lambda_K$ is bounded from above by $\lambda_{optimal}$ defined as follows (Equation (64)):

$$\lambda_K \leq \lambda_{optimal} \equiv \frac{\cos(\theta) + 1}{\sin^2(\theta)} = \frac{1}{1 - \cos(\theta)}. \quad (64)$$

The $\lambda_K = \lambda_{optimal}$ case represents the maximal preferential amplification of lower values of $\cos(\varphi)$ achievable by the algorithm. Let $p_{optimal}(x)$ be the state probability function corresponding to $\lambda_K = \lambda_{optimal}$. From Equation (61), $$p_{optimal}(x) = p_0(x)\left[1 - \frac{\cos(\varphi(x)) - \cos(\theta)}{1 - \cos(\theta)}\right]. \quad (65)$$

Note that $p_{optimal}(x) = 0$ for inputs x with the highest possible value of $\cos(\varphi(x))$, namely 1. In other words, $p_{optimal}$ reaches the limit set by the non-negativity of probabilities, in the context of the non-boolean amplitude amplification algorithm 400, 500 described hereinabove.

Number of Iterations to Perform:

In the non-boolean amplitude amplification algorithm 400, 500 described hereinabove, the number of iterations K to perform is left unspecified. Armed with Equation (62), this aspect of the algorithm 400, 500 will now be described in detail. Higher values of $\lambda_K$ are advantageous to preferentially amplify lower values of $\cos(\varphi)$. Equation (62) illustrates that $\lambda_K$ may be monotonically increasing for K=0, 1, . . . as long as $0 \leq (2K+1)\theta \leq \pi + \theta$ or, equivalently, for $$0 \leq K \leq \left\lfloor \frac{\pi}{2\theta} \right\rfloor, \quad (66)$$

where $\lfloor v \rfloor$ denotes the floor of v. A good approach is to stop the algorithm 400, 500 just before the first iteration that, if performed, would cause value of $\lambda_K$ to decrease (that is, from its value after the previous iteration). This approach leads to the choice K for the number of iterations to perform, given by $$\tilde{K} = \left\lfloor \frac{\pi}{2\theta} \right\rfloor. \quad (67)$$

The corresponding value of $\lambda_K$ for $K = \tilde{K}$ is given by Equation (68):

$$\lambda_{\tilde{K}} = \frac{1}{\sin^2(\theta)}\left[\cos(\theta) - \cos\left(\left\lfloor \frac{\pi}{2\theta} \right\rfloor 2\theta + \theta\right)\right]. \quad (68)$$

The choice $\tilde{K}$ in Equation (67) for the number of iterations offers an amplification iff $\pi > 2\theta > 0$ or, equivalently, iff $0 < \cos(\theta) < 1$. At one of the extremes, namely $\theta = \pi/2$, one has $\lambda_{\tilde{K}} = 0$. The other extreme, namely $\cos(\theta) = 1$, corresponds to every state x with a non zero amplitude in the initial state $|\psi_0\rangle$ having $\cos(\varphi(x)) = 1$. There is no scope for preferential amplification in this case.

Equation (68) illustrates that $\lambda_{\tilde{K}}$ exactly equals $\lambda_{optimal}$ defined in Equation (64) if $\pi/(2\theta)$ is a half-integer. In terms of $\theta$, this condition may be written as follows (Equation (69)):

$$\theta \in \left\{\frac{\pi}{3}, \frac{\pi}{5}, \frac{\pi}{7}, \ldots \text{ (harmonic progression)}\right\} \Rightarrow \lambda_{\tilde{K}} = \lambda_{optimal}. \quad (69)$$

For generic values of θ, Equation (68) illustrates that AR satisfies the following (Equation 70)):

$$\frac{2\cos(\theta)}{\sin^2(\theta)} \leq \lambda_{\tilde{K}} \leq \lambda_{optimal} = \frac{\cos(\theta)+1}{\sin^2(\theta)}. \quad (70)$$

This equation may be rewritten as follows (Equation (71)):

$$\lambda_{optimal}[1-\tan^2(\theta/2)] \leq \lambda_{\tilde{K}} \leq \lambda_{optimal}, \quad (71)$$

using the following identity:

$$\frac{2\cos(\theta)}{\cos(\theta)+1} = \frac{2[\cos^2(\theta/2)-\sin^2(\theta/2)]}{2\cos^2(\theta/2)-1+1} = 1-\tan^2(\theta/2). \quad (72)$$

Equation (71) illustrates that for small θ, $\lambda_R$ is approximately equal to $\lambda_{optimal}$, $C(\theta^2)$ relative error.

Mean and Higher Moments of Cos(φ) after K Iterations:

Let $\mu_K^{(n)}$ be the n-th raw moment of $\cos(\varphi(x))$ for a random value of x sampled by measuring the second register after K iterations.

$$\mu_K^{(n)} \equiv \sum_{x=0}^{N-1} p_K(x)\cos^n(\varphi(x)). \quad (73)$$

Under the notation of Equation (73), $\mu_0^{(1)}$ is simply cos(θ). From Equation (61), $\mu_K^{(n)}$ may be written in terms of the initial moments (K=0) as follows (Equation (74)):

$$\mu_K^{(n)} = \sum_{x=0}^{N-1} p_0(x)\cos^n(\varphi(x))[1-\lambda_K[\cos(\varphi(x))-\cos(\theta)]] \quad (74)$$
$$= \mu_0^{(n)} - \lambda_K[\mu_0^{(n+1)} - \mu_0^{(n)}\mu_0^{(1)}]$$

In particular, let $\mu_K$ and $\sigma_K^2$ represent the expected value and variance, respectively, of $\cos(\varphi(x))$ after K iterations.

$$\mu_K \equiv \mu_K^{(1)},$$

$$\sigma_K^2 \equiv \mu_K^{(2)} - [\mu_K^{(1)}]^2. \quad (75)$$

Now, the result in Equation (74) for n=1 may be written as follows (Equation (76)):

$$\mu_K - \mu_0 = -\lambda_K \sigma_0^2. \quad (76)$$

For $\lambda_K>0$, Equation (76) captures the reduction in the expected value of $\cos(\varphi(x))$ resulting from K iterations of the algorithm 400, 500.

Cumulative Distribution Function of Cos(φ) after K Iterations:

Let $F_K^{cos}(y)$ be the probability that $\cos(\varphi(x)) \leq y$ for an x sampled as per the probability distribution $p_K$. $F_K^{cos}$ is the cumulative distribution function of cos(φ) for a measurement after K iterations, and may be written as follows (Equations (77) and (78)):

$$F_K^{cos}(y) = \sum_{x=0}^{N-1} [p_K(x)1_{[0,\infty)}[y-\cos(\varphi(x))]], \quad (77)$$

$$1 - F_K^{cos}(y) = \sum_{x=0}^{N-1} [p_K(x)(1-1_{[0,\infty)}[y-\cos(\varphi(x))])], \quad (78)$$

where $1_{[0,\infty)}$ is the Heaviside step function, which equals 0 when its argument is negative and 1 when its argument is non-negative. Using the expression for $p_K$ in Equation (61), these equations may be written as follows (Equations (79) and (80)):

$$F_K^{cos}(y) = \quad (79)$$
$$F_0^{cos}(y)(1+\lambda_K\mu_0) - \lambda_K \sum_{x=0}^{N-1} \{p_0(x)\cos(\varphi(x))1_{[0,\infty)}[y-\cos(\varphi(x))]\},$$

$$1 - F_K^{cos}(y) = (1-F_0^{cos}(y))(1+\lambda_K\mu_0) - \quad (80)$$
$$\lambda_K \sum_{x=0}^{N-1} \{p_0(x)\cos(\varphi(x))[1-1_{[0,\infty)}[y-\cos(\varphi(x))]]\}.$$

Every x that provides a non-zero contribution to the summation in Equation (79) satisfies $\cos(\varphi(x)) \leq y$. This fact may be used to write Equation (81), as follows:

$$\lambda_K \geq 0 \Rightarrow F_K^{cos}(y) \geq F_0^{cos}(y)(1+\lambda_K(\mu_0-y)). \quad (81)$$

Likewise, every x that provides a non-zero contribution to the summation in Equation (80) satisfies $\cos(\varphi(x)) > y$. This fact may be used to write Equation (82), as follows:

$$\lambda_K \geq 0 \Rightarrow 1-F_K^{cos}(y) \leq (1-F_0^{cos}(y))(1+\lambda_K(\mu_0-y)). \quad (82)$$

The inequalities in Equations (81) and (82) may be summarized as follows (Equation (83)):

$$\lambda_K \geq 0 \Rightarrow F_K^{cos}(y) \geq F_0^{cos}(y)+\lambda_K \max\{F_0^{cos}(y)(\mu_0-y),(1-F_0^{cos}(y))(y-\mu_0)\}, \quad (83)$$

where the max function represents the maximum of its two arguments. This equation provides a lower bound on the probability that a measurement after K iterations yields a state whose cos(φ) value is no higher than y. Derivation of stronger bounds (or even the exact expression) for $F_K^{cos}(y)$ may be possible if additional information is known about the initial distribution of cos(φ). For $y \leq \mu_0$, the first argument of the max function in Equation (83) will be active, and for $y \geq \mu_0$, the second argument will be active.

For the $\lambda_K \leq 0$ case, it can similarly be shown that $$\lambda_K \leq 0 \Rightarrow F_K^{cos}(y) \leq F_0^{cos}(y)+\lambda_K \min\{F_0^{cos}(y)(\mu_0-y),(1-F_0^{cos}(y))(y-\mu_0)\}, \quad (84)$$

where the min function represents the minimum of its two arguments.

Boolean Oracle Case:

As described in the "Number of Iterations to Perform" section hereinabove, the heuristic choice for the number of iterations for the non-boolean amplitude amplification algorithm of the present invention (namely $\tilde{K}=\lfloor \pi/(2\theta) \rfloor$) is different from, but analogous to, the result for known boolean amplitude amplification algorithm of the prior art (namely $\lfloor \pi/(4\theta_a) \rfloor$). Consider the parameter θ in the boolean oracle case, say $\theta_{bool}$. Let $P_0^{good}$ be the probability for a measurement on the initial state $|\psi_0\rangle$ to yield a winning state. From Equation (30), $$\cos(\theta_{bool}) = \left[-1 \times P_0^{good}\right] + \left[1 \times (1 - P_0^{good})\right] = 1 - 2P_0^{good}, \quad (85)$$

$$\Rightarrow \sin^2(\theta_{bool}/2) = P_0^{good}. \quad (86)$$

Thus, in the boolean oracle case, $\sin^2(\theta/2)$ reduces to the initial probability of "success" (that is, measuring a winning state), which is captured by $\sin^2(\theta_a)$ in known boolean amplitude amplification algorithm(s). The parameter $\theta$ used herein reduces to the parameter $2\theta_a$ used in known boolean amplitude amplification algorithm(s), and $\lfloor \pi/(2\theta) \rfloor$ reduces to $\lfloor \pi/(4\theta_a) \rfloor$.

In this way, the results of the "Analysis of the Non-Boolean Amplitude Amplification Algorithm" section hereinabove in general, and the "Number of Iterations to perform" section hereinabove in particular, may be seen as generalizations of the corresponding results in known boolean amplitude amplification algorithm(s) as described hereinabove.

Alternative Formulation of the Algorithm:

Referring again to FIGS. 4 and 5, in the formulation of the non-boolean amplitude amplification algorithm 400, 500 of the present invention, an ancilla qubit (first register) 410 may be included for the purpose of making the quantity $\langle \Psi_0|U_\varphi|\Psi_0 \rangle = \langle \Psi_0|\alpha \rangle$ real valued. If, in a particular use case, it is guaranteed that $\langle \psi_0|U_\varphi|\psi_0 \rangle$ will be real-valued (or have a negligible imaginary part, for example, and without limitation, by replacing the function $\varphi(x)$ with $\varphi'(x) = r(x)\varphi(x)$, where $r: \{0, 1, \ldots N-1\} \to \{-1,+1\}$ is a random function independent of $\varphi(x)$, with mean 0 (for x sampled by measuring $|\psi_0\rangle$) even without introducing the ancilla 410, then the algorithm 400, 500 described above may be used without the ancilla 410: that is, may alternate between applying operator 430, 432 denoted $S_{\psi_0} U_\varphi$ during the odd iterations and applying operator 430, 434 denoted $S_{\psi_0} U_\varphi^\dagger$ during the even iterations. In other words, the properties and structure of two-register system are not exploited in the algorithm description, beyond making $\langle \Psi_0|U_\varphi|\Psi_0 \rangle$ real-valued.

However, Equations (33) and (34) illustrate that the states $|\alpha\rangle = U_\varphi|\Psi_0\rangle$ and $|\beta\rangle = U_\varphi^\dagger|\Psi_0\rangle$ are related by $$|\beta\rangle = [X \otimes I]|\alpha\rangle, |\alpha\rangle = [X \otimes I]|\beta\rangle, \quad (87)$$

where X is the bit-flip or the Pauli-X operator 340. This relation may be exploited to avoid having two separate cases—k being odd and even—in the final expression for $|\Psi_k\rangle$ in Equation (51). The expression for both cases may be made the same by acting the Pauli-X gate 340 on the ancilla 410, once at the end, if the total number of iterations is even.

More interestingly, the relationship between $|\alpha\rangle$ and $|\beta\rangle$ may be used to avoid having two different operations in the first place, for the odd and even iterations. This leads to the following alternative formulation of the non-boolean amplitude amplification algorithm: During each iteration, odd or even, act the same operator $Q_{iter}$ defined by $$Q_{iter} = S_{\Psi_0} U_\varphi [X \otimes I]. \quad (88)$$

Figure 7:
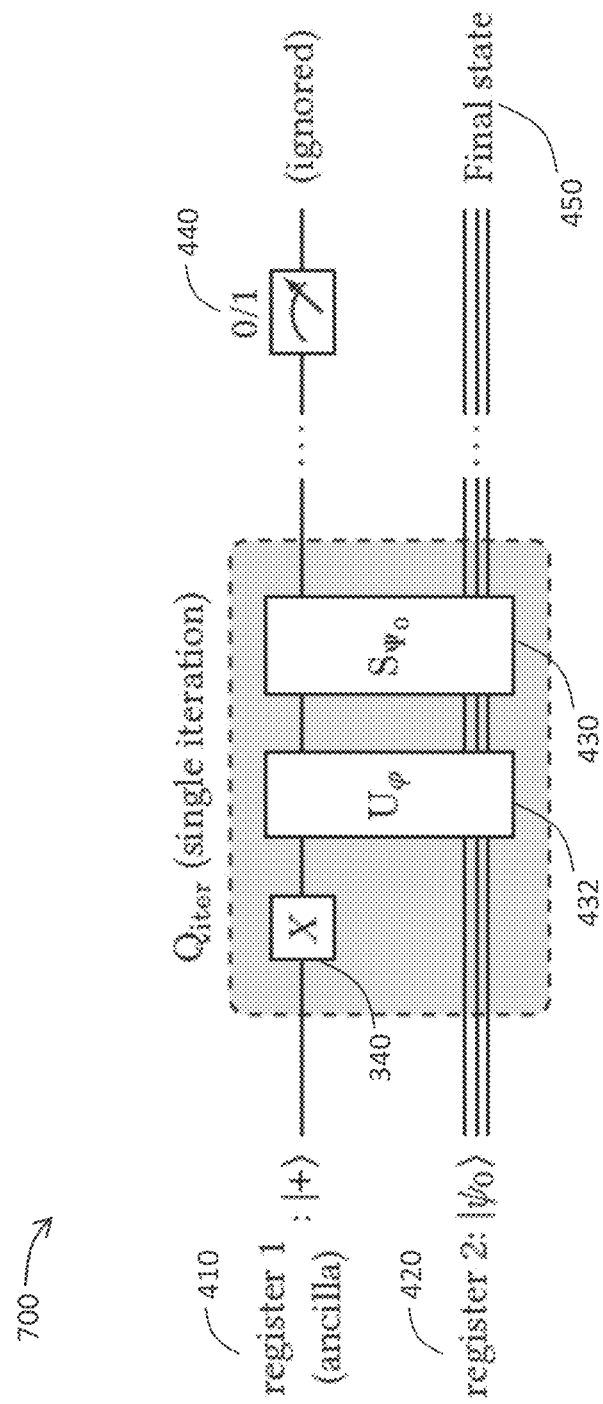
FIG. 7 is schematic diagram depicting a quantum circuit for a second exemplary non-boolean amplification algorithm according to an embodiment of the present invention.

This alternative formulation is depicted as a circuit 700 in FIG. 7 and as a pseudocode 800 in FIG. 8.

From Equations (43) and (87), the action of $Q_{iter}$ on $|\alpha\rangle$ may be derived as follows (Equations (89) and (90)):

$$Q_{iter}|\Psi_0\rangle = S_{\Psi_0} U_\varphi|\Psi_0\rangle = 2\cos(\theta)|\Psi_0\rangle - |\alpha\rangle, \quad (89)$$

$$Q_{iter}|\alpha\rangle = S_{\Psi_0} U_\varphi|\beta\rangle = |\Psi_0\rangle. \quad (90)$$

Let $|\Psi_k^{alt}\rangle$ be the state of the two-register system after k iterations under this alternative formulation 700, 800 (before any measurement of the ancilla 410), as follows (Equation (91)):

$$|\Psi_k^{alt}\rangle \equiv Q_{iter}^k|\Psi_0\rangle. \quad (91)$$

Using similar manipulations as those leading to Equation (51) hereinabove, $|\Psi_k^{alt}\rangle$ may be expressed, for all $k \geq 0$, as follows (Equation (92)):

$$|\Psi_k^{alt}\rangle = \frac{1}{\sin(\theta)}[\sin((k+1)\theta)|\Psi_0\rangle - \sin(k\theta)|\alpha\rangle]. \quad (92)$$

Note that this expression for $|\Psi_k^{alt}\rangle$ is almost identical to the expression for $|\Psi_k\rangle$ in Equation (51), but without two separate cases for the odd and even values of k. Much of the analysis of the original formulation of the non-boolean amplitude amplification algorithm 400, 500 described hereinabove holds for the alternative formulation 700, 800 described hereinabove as well, including the expressions for the state probabilities $p_K(x)$, mean $\mu_K$, raw moments $\lambda_K^{(n)}$, and the cumulative distribution function $F_K^{cos}$.

In addition to simplifying the amplification algorithm (by using the same operation for every iteration), the $Q_{iter}$ operator used in algorithms 700, 800 allows for a clearer presentation of the quantum mean estimation algorithm, as described hereinbelow.

Quantum Mean Estimation Algorithm:

A quantum mean estimation algorithm according to certain embodiments of the present invention may operate to estimate the expected value of $e^{i\varphi(x)}$ for x sampled by measuring a given superposition state $|\psi_0\rangle$. Let $E_{\psi_0}[e^{i\varphi}]$ denote this expected value, as follows (Equation (93)):

$$E_{\psi_0}[e^{i\varphi}] \equiv \langle \psi_0|U_\varphi|\psi_0\rangle = \sum_{x=0}^{N-1}|a_0(x)|^2 e^{i\varphi(x)}. \quad (93)$$

This equation may be written as follows (Equation (94)):

$$E_{\psi_0}[e^{i\varphi}] = \text{Re}[E_{\psi_0}[e^{i\varphi}]] + i\,\text{Im}[E_{\psi_0}[e^{i\varphi}]], \quad (94)$$

where the real and imaginary parts are given by Equations (95) and (96), respectively, as follows:

$$\text{Re}[E_{\psi_0}[e^{i\varphi}]] = \sum_{x=0}^{N-1}|a_0(x)|^2\cos(\varphi(x)), \quad (95)$$

$$\text{Im}[E_{\psi_0}[e^{i\varphi}]] = \sum_{x=0}^{N-1}|a_0(x)|^2\sin(\varphi(x)). \quad (96)$$

The mean estimation may therefore be performed in two parts: one for estimating the mean of $\cos(\varphi)$, and the other for estimating the mean of $\sin(\varphi)$. Note that the expectation of $\cos(\varphi)$ under the state $|\psi_0\rangle$ is precisely $\cos(\theta)$ defined in Equation (30).

Estimating the Mean of $\cos(\varphi)$:

The connection shown in the "Boolean Oracle Case" section hereinabove between the parameter $\theta$ and the parameter $\theta_a$ serves as the intuition behind the quantum mean estimation algorithm of the present invention. In the known boolean amplitude estimation algorithm described hereinabove, the parameter $\theta_a$ is estimated using QPE (Note: The estimation of $\theta_Q$ is only (needed to be) performed up to a two-fold ambiguity of $\{\theta_a, \pi-\theta_a\}$). The estimate for $\theta_a$ is then turned into an estimate for the initial winning probability. The non-boolean quantum mean estimation algorithm of the present invention may operate to estimate the parameter $\theta$ defined in Equation (30) using QPE (Note: The estimation of $\theta$ is only (needed to be) performed up to a two fold ambiguity of $\{\theta, 2\pi-\theta\}$). The estimate for $\theta$ may then be translated into an estimate for the initial expected value of $\cos(\varphi(x))$, namely $\cos(\theta)$.

Toward the end of actualizing the abovementioned intuition into a working algorithm, a key observation is that $|\Psi_0\rangle$ may be written as follows (Equation (97)):

$$|\Psi_0\rangle = \frac{|\eta_+\rangle - |\eta_-\rangle}{\sqrt{2}}, \quad (97)$$

where $|\eta_+\rangle$ and $|\eta_-\rangle$ are given by Equation (98):

$$|\eta_\pm\rangle = \frac{e^{\pm i\theta}|\Psi_0\rangle - |\alpha\rangle}{i\sqrt{2}\sin(\theta)}. \quad (98)$$

Note: The forms of the eigenstates $|\eta_+\rangle$ and $|\eta_-\rangle$ in Equation (98) may be determined from the form of the matrix $S_\theta$ in Equation (48). These forms may also be determined from Equation (92) by rewriting the sin functions in terms of complex exponential functions.

The expressions for $|\eta_+\rangle$ and $|\eta_-\rangle$ in Equation (98) may be used to verify Equation (97). Crucially, $|\eta_+\rangle$ and $|\eta_-\rangle$ are unit normalized eigenstates of the unitary operator $Q_{iter}$, with eigenvalues $e^{i\theta}$ and $e^{-i\theta}$, respectively.

$$Q_{iter}|\eta_\pm\rangle = e^{\pm i\theta}|\eta_\pm\rangle, \quad (99)$$

$$\langle \eta_\pm|\eta_\pm\rangle = 1. \quad (100)$$

The properties of $|\eta_+\rangle$ and $|\eta_-\rangle$ in Equation (99) and Equation (100) may be verified using Equation (89), Equation (90), and Equation (98). The observations in Equation (97) and Equation (99) lead to the following algorithm for estimating $\cos(\theta)$:

(1) Perform the QPE algorithm with a) the two-register operator $Q_{iter}$ serving the role of the unitary operator under consideration, and b) the superposition state $|\Psi_0\rangle$ in place of the eigenstate required by the QPE algorithm as input. Let the output of this step, appropriately scaled to be an estimate of the phase angle in the range $[0, 2\pi)$, be $\hat{\omega}$.

(2) Return $\cos(\hat{\omega})$ as the estimate for $\cos(\theta)$ (i.e., the real part of $E_{\psi_0}[e^{i\varphi}]$). Note: If the circuit implementation of $Q_{iter}$ is wrong by an overall (state independent) phase $\phi_{err}$, then the estimate for $\cos(\theta)$ is $\cos(\hat{\omega} - \phi_{err})$. This is important, for example, if the operation $[2|0\rangle\langle 0| - I]$ is only implemented up to a factor of $-1$ (i.e., with $\phi_{err} = \pi$). Note that the final state probabilities under the non-boolean amplitude amplification algorithm are unaffected by such an overall phase error.

Proof of correctness of the algorithm: $|\Psi_0\rangle$ is a superposition of the eigenstates $|\eta_+\rangle$ and $|\eta_-\rangle$ of the unitary operator $Q_{iter}$. This implies that $\hat{\omega}$ may either be an estimate for the phase angle of $|\eta_+\rangle$, namely $\theta$, or an estimate for the phase angle of $|\eta_-\rangle$, namely $2\pi-\theta$. (Note: If $\theta=0$, the phase angle being estimated is 0 for both $|\eta_+\rangle$ and $|\eta_-\rangle$. For $\theta\neq 0$, $\hat{\omega}$ will be an estimate for either $\theta$ or $2\pi-\theta$ with equal probability. Since $\theta$ lies in $[0,\pi]$ and $2\pi-\theta$ lies in $[\pi, 2\pi]$, the output $\hat{\omega}$ can be converted into an estimate for $\theta$ alone (although doing so is not necessary)). Since, $\cos(2\pi-\theta)=\cos(\theta)$, it follows that $\cos(\hat{\omega})$ is an estimate for $\cos(\theta)$.

Estimating the Mean of $e^{i\varphi}$:

The algorithm for estimating the expected value of $\cos(\varphi)$ in the section hereinabove may be re-purposed to estimate the expected value of $\sin(\varphi)$ by using the fact that $$\sin(\varphi) = \cos(\varphi - \pi/2). \quad (101)$$

In other words, the imaginary part of $E_{\psi_0}[e^{i\varphi}]$ is the real part of $E_{\psi_0}[e^{i(\varphi-\pi/2)}]$. By using the oracle $U_{\varphi-\pi/2}$ (for the function $\varphi-\pi/2$), instead of $U_\varphi$, in the mean estimation algorithm of the preceding section, the imaginary part of $E_{\psi_0}[e^{i\varphi}]$ may also be estimated. This completes the estimation of $E_{\psi_0}[e^{i\varphi}]$.

For concreteness, $U_{\varphi-\pi/2}$ may be explicitly written as $$U_{\varphi-\pi/2} = e^{-i\pi/2}|0\rangle\langle 0| \otimes U_\varphi + e^{i\pi/2}|1\rangle\langle 1| \otimes U_\varphi^\dagger. \quad (102)$$

Figure 9:
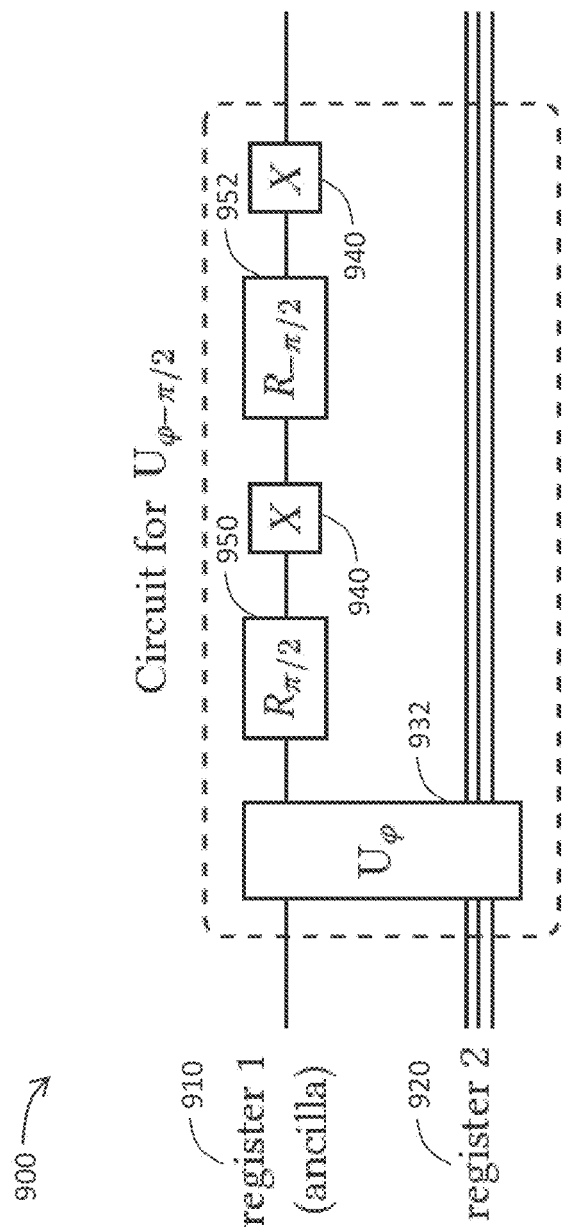
FIG. 9 is a schematic diagram depicting a quantum circuit for a non-boolean mean estimation algorithm according to an embodiment of the present invention.

Referring now to FIG. 9, exemplary circuit 900 illustrates implementation of $U_{\varphi-\pi/2}$ using the oracle 932 denoted $U_\varphi$, the bit-flip operator 940 denoted X, and the phase-shift operator $R_\phi$ (shown as elements 950, 952).

Note that the algorithm does not use the knowledge that $\{|0\rangle, \ldots, |N-1\rangle\}$ is an eigenbasis of $U_\varphi$. Therefore, this algorithm may be used to estimate $\langle \psi_0|U|\psi_0\rangle$ for any unitary operator U.

Quantum Speedup:

The speedup offered by the quantum mean estimation algorithm 900 over classical methods will now be discussed in detail, in the context of estimating the mean of $\cos(\varphi)$ alone. This discussion may be extended in a straightforward way to estimation of $E_{\psi_0}[e^{i\varphi}]$.

Classical Approaches to Estimating the Mean: For an arbitrary function $\varphi$ and a known sampling distribution $p_0(x)$ for the inputs x, one classical approach to finding the mean of $\cos(\varphi(x))$ is to sequentially query the value of $\varphi(x)$ for all the inputs and use the query results to compute the mean. Let the permutation $(x_0, x_1, \ldots, x_{N-1})$ of the inputs $(0, 1, \ldots, N-1)$ be the order in which the inputs are queried. The range of allowed values of $\cos(\theta)$, based only on results for the first q inputs, is given by the following (Equation (103)):

$$\left[\sum_{j=0}^{q-1} p_0(x)\cos(\varphi(x_j)) - \sum_{j=q}^{N-1} p_0(x)\right] \leq \quad (103)$$

$$\cos(\theta) \leq \left[\sum_{j=0}^{q-1} p_0(x)\cos(\varphi(x_j)) + \sum_{j=q}^{N-1} p_0(x)\right].$$

These bounds are derived by setting the values of $\cos(\varphi)$ for all the unqueried inputs to their highest and lowest possible values, namely +1 and $-1$. The range of allowed values of $\cos(\theta)$ shrinks as more and more inputs are queried. In particular, if $p_0(x)$ is equal for all the inputs x, the width of the allowed range (based on q queries) is given by $2(N-q)/N$. This strategy may take $\mathcal{O}(N)$ queries before the width of the allowed range reduces to even, say, 1. Thus, this strategy will not be feasible for large values of N.

An alternative classical approach is to probabilistically estimate the expected value as follows:

(1) Independently sample q random inputs $(x_1, \ldots x_q)$ as per the distribution $p_0$.

(2) Return the sample mean of $\cos(\varphi)$ over the random inputs as an estimate for $\cos(\theta)$.

Under this approach, the standard deviation of the estimate scales as $\sim \sigma_0/\sqrt{q}$, where $\sigma_0$ is the standard deviation of $\cos(\varphi)$ under the distribution $p_0$.

Precision Vs Number of Queries for the Quantum Algorithm: Note that one call to the operator $Q_{iter}$ corresponds to $\mathcal{O}(1)$ calls to $A_0$ and $U_\varphi$ (and their inverses). Let q be the number of times the (controlled) $Q_{iter}$ operation is performed during the QPE subroutine. As q increases, the uncertainty on the estimate for the phase-angle θ (up to a two-fold ambiguity) falls at the rate of $\mathcal{O}(1/q)$. Consequently, the uncertainty on $\cos(θ)$ also falls at the rate of $\mathcal{O}(1/q)$. This represents a quadratic speedup over the classical, probabilistic approach, under which the error falls as $\mathcal{O}(1/\sqrt{q})$.

Note that the variance of the estimate for $\cos(θ)$ is independent of a) the size of input space N, and b) the variance $\sigma_0^2$ of $\cos(\varphi(x))$ under the distribution $p_0(x)$. It only depends on the true value of $\cos(θ)$ and the number of queries q performed during the QPE subroutine.

Demonstrating the Algorithms Using a Toy Example

Referring again to FIGS. 4, 5, and 9, the non-boolean amplitude amplification algorithm 400, 500 and the mean estimation algorithm 900 will both be demonstrated using a toy example. Let the input to the oracle $U_\varphi$ (i.e., the second register 420), contain 8 qubits. This leads to $2^8=256$ basis input states, namely $|0\rangle, \ldots, |255\rangle$. Let the toy function $\varphi(x)$ be $$\varphi(x) = \frac{x}{255}\frac{\pi}{4}, \text{ for } x = 0, 1, \ldots, 255. \quad (104)$$

The largest phase-shift applied by the corresponding oracle 432 denoted $U_\varphi$ on any basis state is $\pi/4$, for the state $|255\rangle$. Since, $\cos(\varphi(x))$ is monotonically decreasing in x, the goal of the amplitude amplification algorithm 400, 500 is to amplify the probabilities of higher values of x.

Let the initial state, from which the amplification is performed, be the uniform superposition state $|s\rangle$.

$$|\psi_0\rangle = |s\rangle = \frac{1}{\sqrt{256}}\sum_{x=0}^{255}|x\rangle. \quad (105)$$

Such simple forms for the oracle function and the initial state allow for a good demonstration of the algorithms of the present invention.

For this toy example, from Equation (30), $\cos(θ)$ and θ are given by $$\cos(θ) = \frac{1}{256}\sum_{x=0}^{255}\cos\left(\frac{x}{255}\frac{\pi}{4}\right) \approx 0.9001, \quad (106)$$

$$θ \approx 0.4507.$$

Figure 10:
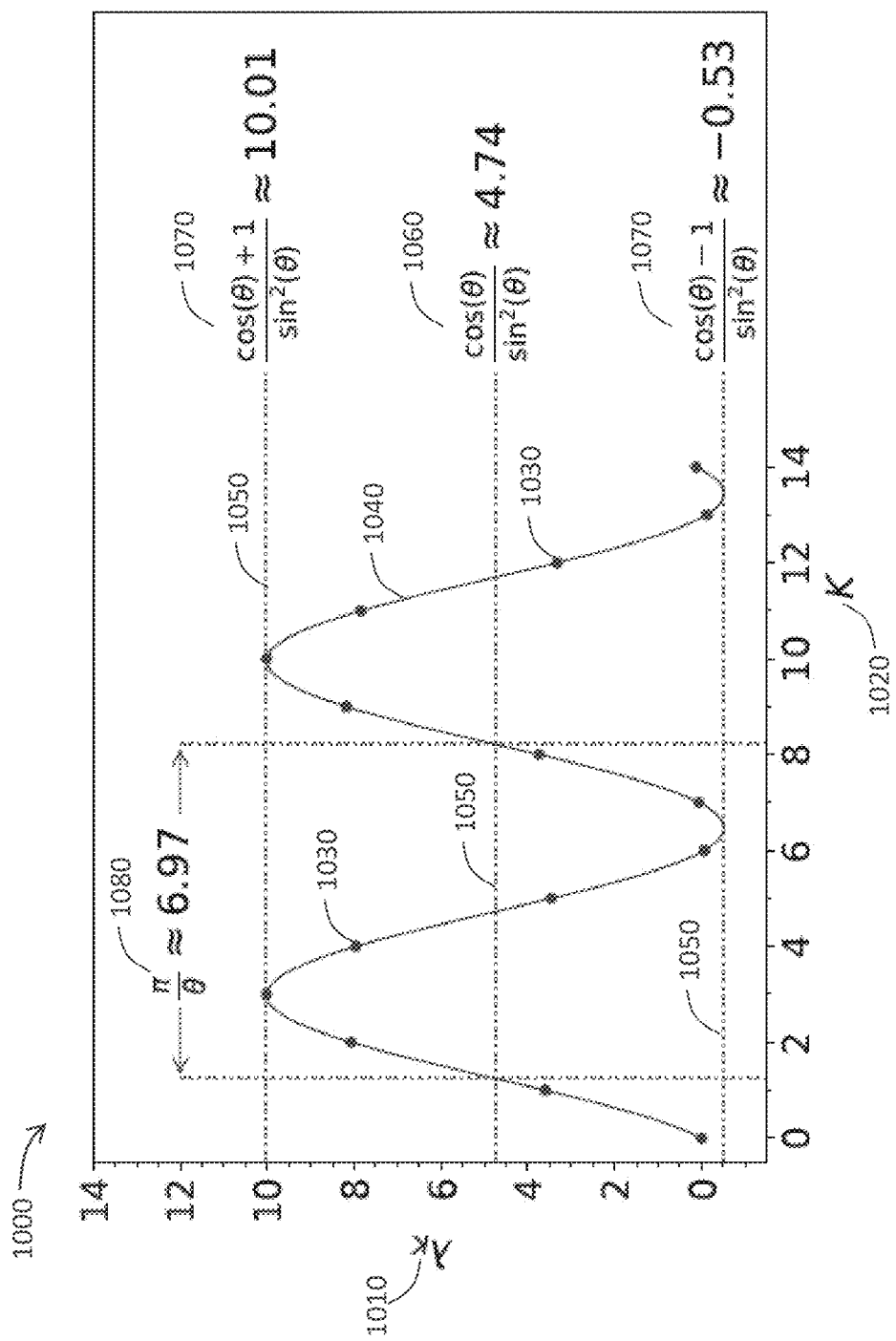
FIG. 10 depicts a graph of oracle function and initial state of a toy example for quantum simulation.

Referring now to FIG. 10, graph 1000 shows the value 1010 of $\lambda_K$, from Equation (62), for the first few of a range 1020 of values of K (more specifically, for K=0, 1, ..., 14). The dots 1030 (only a subset labeled, for clarity) correspond to the different integer values 1020 of K. The black solid curve 1040 depicts the sinusoidal dependence of the value 1010 of $\lambda_K$ on the range 1040 of K. The dotted lines 1050 indicate that the value 1010 of $\lambda_K$ oscillates around a reference 1060 of $\cos(θ)/\sin^2(θ)$ with an amplitude 1070 of $1/\sin^2(θ)$ and a period 1080 of $\pi/θ$ (in K values). The heuristic choice for the total number of iterations $\tilde{K}=[\pi/(2θ)]$ is 3 for this example.

Figure 11:
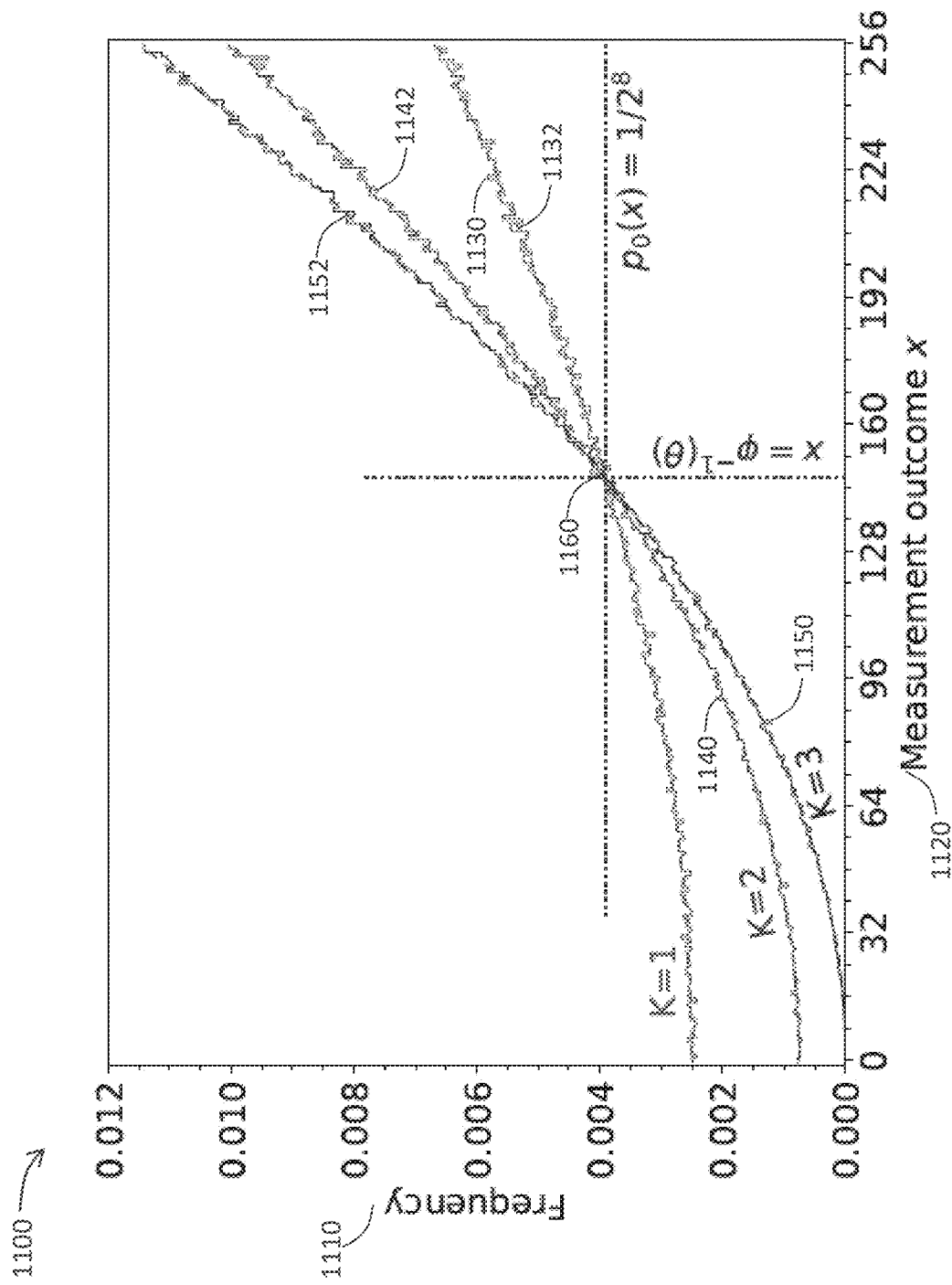
FIG. 11 depicts a graph of quantum simulation results from application of the non-boolean amplitude amplification algorithm of FIG. 4 to the toy example of FIG. 10.

Amplitude Amplification:

Continuing with the toy example, and referring now to chart 1100 of FIG. 11, the quantum circuit for the non-boolean amplitude amplification algorithm 400, 500 was implemented in a quantum computing framework for three different values of the total number of iterations K, namely K=1, 2, and 3. The solid histograms 1130, 1140, 1150 show the observed measurement frequencies 1110 of the different values 1120 of $x \in \{0, 1, \ldots, 255\}$ after performing the non-boolean amplitude amplification algorithm 400, 500. The solid histograms 1130, 1140, 1150 correspond to the total number of iterations K being 1, 2, and 3, respectively. In each case, the observed frequencies are based on simulating (and measuring) the circuit for the algorithm $10^6$ times (i.e., $10^6$ shots). The dashed curves 1132, 1142, 1152, in good agreement (almost coincident) with their corresponding solid histograms 1130, 1140, 1150, respectively, show the predictions $p_K(x)$ (for the measurement frequencies) computed using Equation (61). While $p_K(x)$ may be technically defined only for the integer values of x, in FIG. 11 the dashed curves 1132, 1142, 1152 are interpolated for non-integer values of x using Equation (61).

As can be seen from FIG. 11, in each case, the algorithm 400, 500 preferentially amplifies lower values of $\cos(\varphi(x))$ or, equivalently, higher values of x. This result is expected from the fact that $\lambda_K>0$ for all three values of K. Furthermore, as K increases from 0 to $\tilde{K}=3$, the preferential amplification grows stronger. Note that the probabilities of the x-s for which $\cos(\Phi(x)) \approx \cos(θ)$ are left approximately unchanged by the algorithm, as indicated by the dotted crosshair 1160.

Figure 12:
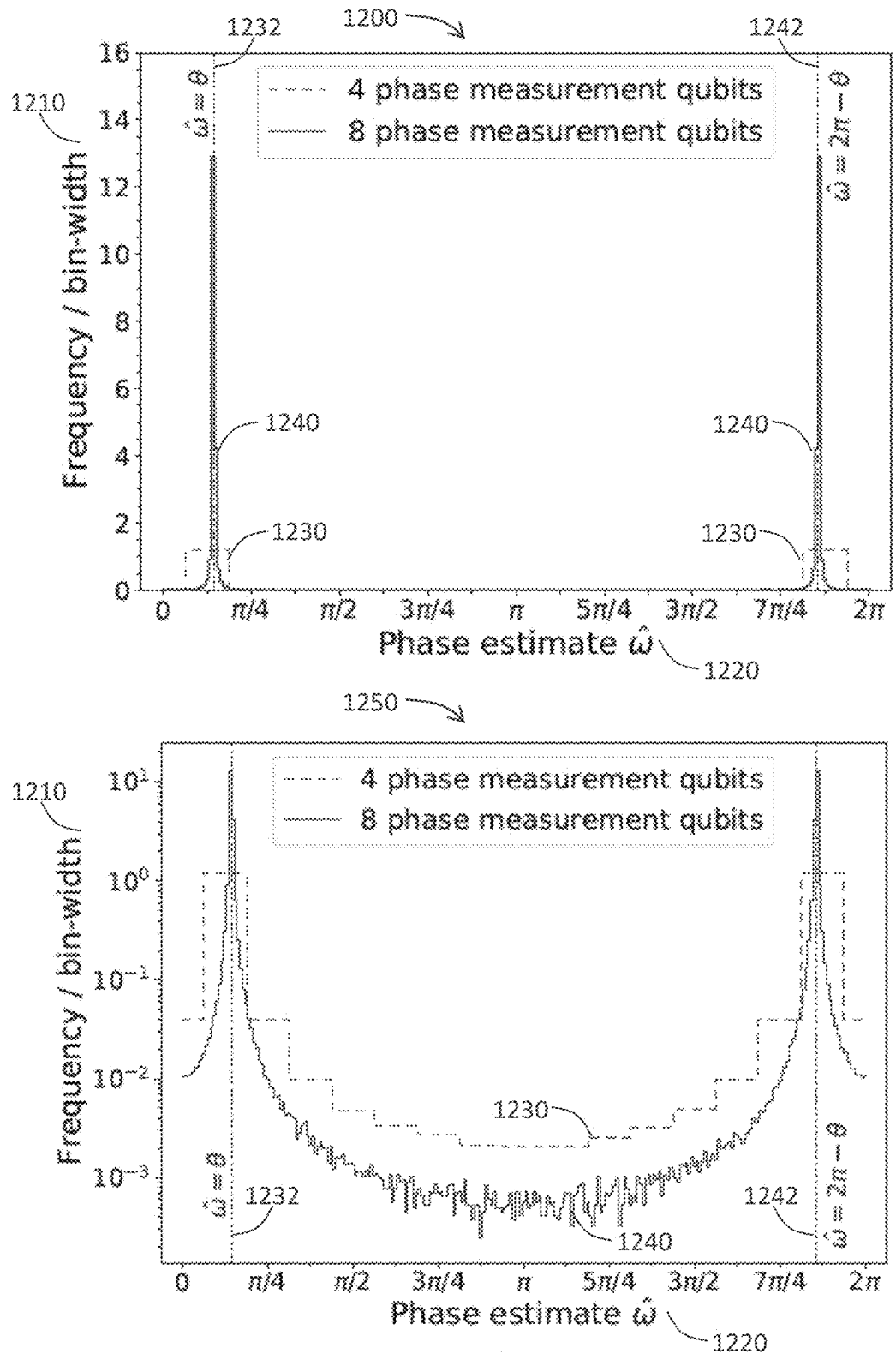
FIG. 12 depicts graphs of quantum simulation results from application of the non-boolean mean estimation algorithm of FIG. 9 to the toy example of FIG. 10.

Mean Estimation:

Continuing with the toy example, and referring now to graphs 1200, 1250 of FIG. 12, results of demonstrating the quantum circuit for the non-boolean mean estimation algorithm 900 will now be described in detail. Only the estimation of $\cos(θ)$ (i.e., the real part of $E_{\psi_0}[e^{i\varphi}]$) is demonstrated herein. The imaginary part may also be estimated using the same technique, as described in "Estimating the Mean of $e^{i\varphi}$" hereinabove.

Let M be the number of qubits used in the QPE subroutine of the mean estimation algorithm 900, to contain the phase information. This corresponds to performing the (controlled) $Q_{iter}$ operation $2^M-1$ times during the QPE subroutine. Note that the estimated phase $\hat{\omega}$ may only take the following discrete values:

$$\hat{\omega} \in \left\{\frac{2\pi j}{2^M} \,|\, j \in \{0, \ldots, 2^M - 1\}\right\}. \quad (107)$$

In this way, the value of M controls the precision of the estimated phase and, by extension, the precision of the estimate for $\cos(θ)$; the higher the value of M, the higher the precision.

For the demonstration, two different quantum circuits were implemented, again using a quantum computing framework, for the mean estimation algorithm 900; one with M=4 and the other with M=8. Each circuit was simulated (and measured) $10^6$ times, to get a sample of $\hat{\omega}$ values all in the range $[0, 2\pi)$.

The observed frequencies 1210 (scaled by 1/bin-width) of the different values 1220 of $\hat{\omega}$ are shown as histograms on a linear scale in top graph 1200, and on a logarithmic scale in the bottom graph 1250. Here the bin-width of the histograms is given by $2\pi/2^M$, which is the difference between neighboring allowed values of $\hat{\omega}$.

The dashed histogram 1230 and solid histogram 1240 correspond to the circuits with 4 and 8 phase measurement qubits, respectively. The exact values of $\theta$ and $2\pi-\theta$ for the toy example are indicated with vertical dotted lines 1232, 1242, respectively. In both cases (M=4 and M=8), the observed frequencies peak near the exact values of $\theta$ and $2\pi-\theta$, demonstrating that $\hat{\omega}$ is a good estimate for them, up to a two-fold ambiguity. (Note: The upward trends near the left (−1) and right (+1) edges of the plots in are artifacts caused by the Jacobian determinant for the map from $\hat{\omega}$ to $\cos(\hat{\omega})$). Furthermore, as expected, using more qubits for estimating the phase leads to a more precise estimate.

Ancilla-Free Versions of the Algorithms:

Both algorithms introduced this in this paper so far, namely (1) the amplitude algorithm of FIGS. 4 and 5 and its alternative formulation in FIG. 8, and (2) the mean estimation algorithm of FIG. 9, use an ancilla qubit to make the quantity $\langle\Psi_0|U_\varphi|\Psi_0\rangle$ real valued. This is important for achieving the respective goals of the algorithms. However, the same algorithms may be performed without the ancilla, albeit to achieve different goals, which may be relevant in some use cases.

Ancilla-Free Non-Boolean Amplitude Amplification:

The ancilla-free version of the amplitude amplification algorithm is almost identical to the algorithm introduced hereinabove at FIGS. 4 and 5. The only difference is that, in the ancilla-free version, the single-register operators $S_{\psi_0}$, $U_\varphi$, and $U_\varphi^\dagger$ are used in place of the two-register operators $S_{\Psi_0}$, $U_\varphi$, and $U_\varphi^\dagger$, respectively. For concreteness, the ancilla-free algorithm may proceed as follows:

(1) Initialize a system in the state $|\psi_0\rangle$.

(2) Act the operation $S_{\psi_0}U_\varphi$ during the odd iterations and $S_{\psi_0}U_\varphi^\dagger$ during the even iterations.

Analogous to the two-register states $|\alpha\rangle$ and $|\beta\rangle$ in Equations (31) and (32), let the single-register states $|\alpha'\rangle$ and $|\beta'\rangle$ be defined as $$2|\alpha'\rangle \equiv U_\varphi|\psi_0\rangle = \sum_{x=0}^{N-1} e^{i\varphi(x)} a_0(x)|x\rangle, \tag{108}$$

$$|\beta'\rangle \equiv U_\varphi^\dagger|\psi_0\rangle = \sum_{x=0}^{N-1} e^{-i\varphi(x)} a_0(x)|x\rangle.$$

Analogous to $\theta$ defined in Equation (30), let $\theta' \in [0,\pi/2]$ and $\delta \in [0,2\pi)$ be implicitly defined by $$\cos(\theta')e^{i\delta} \equiv \langle\psi_0|\alpha'\rangle = \sum_{x=0}^{N-1} |a_0(x)|^2 e^{i\varphi(x)}. \tag{109}$$

Variables $\cos(\theta')$ and $\delta$ are the magnitude and phase, respectively, of the initial (i.e., x sampled from $|\psi_0\rangle$) expected value of $e^{i\varphi}$. An important difference between $\theta'$ and $\theta$ is that $\cos(\theta')$ is restricted to be non-negative, unlike $\cos(\theta)$, which may be positive, negative, or zero.

Note that $\cos(\theta')$ may be written as $$\cos(\theta') = \sum_{x=0}^{N-1} |a_0(x)|^2 e^{i\varphi'(x)}, \tag{110}$$

where $\varphi'(x)$ is given by $$\varphi'(x) \equiv \varphi(x) - \delta. \tag{111}$$

Acting the oracle $U_\varphi$ for the function $\varphi$ may be thought of as acting the oracle $U_{\varphi'}$ for the function $\varphi'$, followed by performing a global, state independent phase-shift of $\delta$. Furthermore, from Equation (120), it can be seen that $\langle\psi_0|U_{\varphi'}|\psi_0\rangle$ is real-valued. This observation may be used to re-purpose the analysis in the "Analysis of the Non-Boolean Amplitude Amplification Algorithm" section hereinabove for the ancilla-free version; the corresponding results are presented here without explicit proofs.

Let $|\psi'_k\rangle$ be the state of the system of the after $k \geq 0$ iterations of the ancilla-free algorithm. Analogous to Equation (51), $|\psi'_k\rangle$ may be written as $$|\psi'_k\rangle = \begin{cases} \dfrac{e^{i\delta}}{\sin(\theta')}[\sin((k+1)\theta')|\psi_0\rangle - \sin(k\theta')e^{-i\delta}|\alpha'\rangle], & \text{if } k \text{ is odd,} \\ \dfrac{1}{\sin(\theta')}[\sin((k+1)\theta')|\psi_0\rangle - \sin(k\theta')e^{i\delta}|\beta'\rangle], & \text{if } k \text{ is even.} \end{cases} \tag{112}$$

Let $p'_K(x)$ be the probability of measuring the system in state x after K iterations. Analogous to Equation (61), $p'_K(x)$ can be written as follows (Equation (113)):

$$p'_K(x) = p_0(x)\{1 - \lambda'_K[\cos(\varphi(x)-\delta) - \cos(\theta')]\}, \tag{113}$$

where the $\lambda'_K$, the ancilla-free analogue of $\lambda_K$, is given by $$\lambda'_K = \frac{2\sin(K\theta')\sin((K+1)\theta')}{\sin^2(\theta')} = \frac{\cos(\theta') - \cos((2K+1)\theta')}{\sin^2(\theta')}. \tag{114}$$

In this case, the probability amplification factor $p'_K/p_0$ is linear in $\cos(\varphi-\delta)$.

Ancilla-Free Mean Estimation:

The ancilla-free mean estimation algorithm described in this subsection may estimate the magnitude of $\langle\psi_0|U|\psi_0\rangle$ for a given unitary operator U. Hereinbelow the algorithm is presented in terms of the oracle $U_\varphi$, and the goal of the algorithm is to estimate $\cos(\theta')$ from Equation (109) (i.e., the magnitude of $E_{\psi_0}[e^{i\varphi}] \equiv \langle\psi_0|U_\varphi|\psi_0\rangle$).

Let the unitary operator $Q_{evenodd}$ be defined as follows (Equation (115)):

$$Q_{evenodd} \equiv S_{\psi_0} U_\varphi S_{\psi_0} U_\varphi^\dagger. \tag{115}$$

Its action corresponds to performing the (ancilla-free) even-iteration operation once, followed by the odd-iteration operation. Analogous to Equations (97) and (98), the state $|\psi_0\rangle$ can be written as $$|\psi_0\rangle = \frac{|\eta'_+\rangle - |\eta'_-\rangle}{\sqrt{2}}, \tag{116}$$

where $|\eta'_+\rangle$ and $|\eta'_-\rangle$ are given by $$|\eta'_\pm\rangle = \frac{e^{\pm i\theta'}|\psi_0\rangle - e^{-i\delta}|\alpha'\rangle}{i\sqrt{2}\sin(\theta')}. \tag{117}$$

$|\eta'_+\rangle$ and $|\eta'_-\rangle$ are unit-normalized eigenstates of $Q_{evenodd}$ with eigenvalues $e^{2i\theta}$, and $e^{-2i\theta}$, respectively.

$$Q_{evenodd}|\eta'_{\pm}\rangle = e^{\pm 2i\theta'}|\eta'_{\pm}\rangle, \quad (118)$$

$$\langle \eta'_{\pm}|\eta'_{\pm}\rangle = 1. \quad (119)$$

The observations in Equations (118) and (119) lead to the following algorithm for estimating $\cos(\theta')$:

(1) Perform the QPE algorithm with $Q_{evenodd}$ serving the role of the unitary operator under consideration, and the superposition state $|\psi_0\rangle$ in place of the eigenstate required by the QPE algorithm as input. Let the output of this step, appropriately scaled to be an estimate of the phase angle in the range $[0, 2\pi)$, be $\hat{\omega}$.

(2) Return $|\cos(\hat{\omega}/2)|$ as the estimate for $\cos(\theta')$.

In this version of the algorithm, $\hat{\omega}$ will be an estimate for either $2\theta$ or $2\pi - 2\theta$. (Note: If $\theta' = 0$, the phase angle being estimated is 0 for both $|\eta'_+\rangle$ and $|\eta'_-\rangle$.) So, $\hat{\omega}/2$ will be an estimate for either $\theta'$ or $\pi - \theta'$. Since, a) $\cos(\pi - \theta') = -\cos(\theta')$, and b) $\cos(\theta')$ is a non-negative number, it follows that $|\cos(\hat{\omega}/2)|$ is an estimate for $\cos(\theta')$.

Potential advantageous applications of the algorithms of the present invention may include the following:

Approximate Optimization:

A straightforward application of the non-boolean amplitude amplification algorithm of the present invention is in the optimization of objective functions defined over a discrete input space. The objective function to be optimized needs to be mapped onto the function φ of the oracle $U_\varphi$, with the basis states of the oracle corresponding to the different discrete inputs of the objective function. After performing an appropriate number of iterations of the algorithm, measuring the state of the system will yield "good" states with amplified probabilities. Multiple repetitions of the algorithm (multiple shots) may be performed to probabilistically improve the quality of the optimization.

Note that the technique is not guaranteed to yield the true optimal input, and the performance of the technique will depend crucially on factors like a) the map from the objective function to the oracle function φ, b) the number of iterations K, c) the initial superposition $|\psi_0\rangle$, and, in particular, d) the initial distribution of φ under the superposition $|\psi_0\rangle$. This approach joins known quantum optimization techniques.

Simulating Probability Distributions:

The amplitude amplification algorithm may be useful for simulating certain probability distributions. By choosing the initial state $|\psi_0\rangle$, oracle $U_\varphi$, and the number of iterations K, one can control the final sampling probabilities $p_K(x)$ of the basis states; the exact expression for $p_K(x)$ in terms of these factors is given in Equation (61).

Estimating the Overlap Between Two States:

Let $|\psi\rangle$ and $|\phi\rangle$ be two different states produced by acting the unitary operators A and B, respectively, on the state $|0\rangle$.

$$|\psi\rangle = A|0\rangle, |\phi\rangle = B|0\rangle. \quad (120)$$

Estimating the overlap $|\langle\psi|\phi\rangle|$ between the two states is an important task with several applications, including in Quantum Machine Learning (QML). Several algorithms, including the Swap test, can be used for estimating this overlap. For the Swap test, the uncertainty in the estimated value of $|\langle\psi|\phi\rangle|$ falls as $\mathcal{O}(1/\sqrt{q})$ in the number of queries q to the unitaries A and B (used to the create the states $|\psi\rangle$ and $|\phi\rangle$).

On the other hand, the mean estimation algorithm of the present invention also be used to estimate $\langle\psi|\phi\rangle$ by noting that $$\langle\psi|\phi\rangle = \langle 0|A^\dagger B|0\rangle. \quad (121)$$

So, by setting $$U \equiv A^\dagger B, \quad (122)$$

$$|\psi_0\rangle \equiv |0\rangle, \quad (123)$$

values $\langle\psi|\phi\rangle$ may be estimated as $\langle\psi_0|U|\psi_0\rangle$ using the mean estimation algorithm of FIG. 9. If one is only interested in the magnitude of $\langle\psi|\phi\rangle$, the ancilla-free version of the mean estimation algorithm described hereinabove will also suffice. Since, for the mean estimation algorithm, the uncertainty of the estimate falls as $\mathcal{O}(1/q)$ in the number of queries q to the unitaries A and B (or their inverses), this approach offers a quadratic speedup over the Swap test. Furthermore, the $\mathcal{O}(1/q)$ scaling of the error achieved by this approach matches the performance of the known optimal quantum algorithm for the overlap-estimation task.

Meta-Oracles to Evaluate the Superposition $|\psi\rangle$ and Unitary U:

Recall from Equations (97) and (98) that $$Q_{iter}|\Psi_0\rangle = \frac{e^{i\theta}|\eta_+\rangle - e^{-i\theta}|\eta_-\rangle}{\sqrt{2}}, \quad (124)$$

where $\cos(\theta)$ is the real part of $\langle\psi_0|U_\varphi|\psi_0\rangle$. Note that the parameter $\theta$ depends on the superposition $|\psi_0\rangle$ and the unitary $U_\varphi$. The action of $Q_{iter}$ on $|\Psi_0\rangle$ is to apply a phase-shift of $\theta$ on the projection along $|\eta_+\rangle$ and a phase-shift of $-\theta$ on the projection along $|\eta_-\rangle$. This property may be used to create a meta-oracle which evaluates the superposition $|\Psi_0\rangle$ and/or the unitary $U_\varphi$ (or a generic unitary U) based on the corresponding value of $\theta$. More specifically, if the circuit $A_0$ for producing $|\Psi_0\rangle$ and/or the circuit for U are additionally parameterized using "control" quantum registers (provided as inputs to the circuits), then a meta-oracle may be created using Equation (24) to evaluate the states of the control registers. Such meta-oracles may be used with quantum optimization algorithms, including the non-boolean amplitude amplification algorithm of the present invention, to find "good" values (or states) of the control registers.

Variational quantum circuits (i.e., quantum circuits parameterized by (classical) free parameters) have several applications, including in QML. Likewise, quantum circuits parameterized by quantum registers may also have applications (e.g., in QML and quantum statistical inference).

Some of the illustrative aspects of the present invention may be advantageous in solving the problems herein described and other problems not discussed which are discoverable by a skilled artisan.

While the above description contains much specificity, these should not be construed as limitations on the scope of any embodiment, but as exemplifications of the presented embodiments thereof. Many other ramifications and variations are possible within the teachings of the various embodiments. While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

Thus, the scope of the invention should be determined by the appended claims and their legal equivalents, and not by the examples given.

That which is claimed is:

1. A method of performing quantum calculation on an oracle $U_\varphi$ for a non-boolean function $\varphi$, comprising:
   initializing an ancilla qubit in a $|+\rangle$ state and an input qubit in a $|\psi_0\rangle$ state of a plurality of eigenstates $|x\rangle$ to define a two-register state $|\Psi_0\rangle \equiv |+,\psi_0\rangle$;
   for each of a plurality K of iterations
      receiving, using the input qubit, a respective one of the plurality of eigenstates $|x\rangle$ defining an input basis state,
      for odd iterations, acting on the input basis state using a selective phase-flip unitary operator circuit $S_{\Psi_0}$ and a controlled unitary operator circuit $U_\varphi$, and
      for even iterations, acting on the input basis state using the selective phase-flip unitary operator circuit $S_{\Psi_0}$ and a controlled inverse unitary operator circuit $U_\varphi^\dagger$.

2. The method according to claim 1, further comprising measuring, after the plurality K of iterations, the ancilla qubit in a 0/1 basis.

3. The method according to claim 1, wherein the selective phase-flip unitary operator circuit $S_{\Psi_0}$ further comprises:
   a Hadamard transform H,
   a unitary operator $A_0$,
   a unitary operator I, and
   an inverse unitary operator $A_0^\dagger$;
   wherein the selective phase-flip unitary operator $S_{\Psi_0} = [H \otimes A_0][2|0,0\rangle\langle 0,0|-I][H \otimes A_0^\dagger]$.

4. The method according to claim 1, wherein the acting on the input basis state using the selective phase-flip unitary operator circuit $S_{\Psi_0}$ and the controlled unitary operator circuit $U_\varphi$ further comprises, for the ancilla qubit in a state $|0\rangle$, acting on the input qubit as $U_\varphi|0,x\rangle = e^{+i\varphi(x)}|0,x\rangle$, $U_\varphi|1,x\rangle = e^{-i\varphi(x)}|1,x\rangle$.

5. The method according to claim 1, wherein the acting on the input basis state using the selective phase-flip unitary operator circuit $S_{\Psi_0}$ and the controlled inverse unitary operator circuit $U_\varphi^\dagger$ further comprises, for the ancilla qubit in a state $|1\rangle$, acting on the input qubit as $U_\varphi^\dagger|0,x\rangle = e^{+i\varphi(x)}|0,x\rangle$, $U_\varphi^\dagger|1,x\rangle = e^{-i\varphi(x)}|1,x\rangle$.

6. The method according to claim 1, further comprising:
   receiving, using the input qubit, the $|\psi_0\rangle$ state defining an input random state;
   acting on the input random state using a controlled estimation unitary operator circuit $U_{\varphi-\pi/2}$.

7. The method according to claim 6, wherein the controlled estimation unitary operator circuit $U_{\varphi-\pi/2}$ further comprises:
   the controlled unitary operator circuit $U_\varphi$,
   at least one bit-flip operator X, and
   at least one phase-shift operator $R_\varphi$;
   wherein the controlled estimation unitary operator circuit $U_{\varphi-\pi/2} = e^{-i\pi/2}|0\rangle\langle 0| \otimes U_\varphi + e^{i\pi/2}|1\rangle\langle 1| \otimes U_\varphi^\dagger$.

8. A quantum computing device for performing quantum calculation on an oracle $U_\varphi$ for a non-boolean function $\varphi$, comprising:
   a two-register quantum system comprising
      an ancilla qubit, and
      an input qubit; and
   a non-boolean quantum oracle comprising
      a selective phase-flip unitary operator circuit $S_{\Psi_0}$,
      a controlled unitary operator circuit $U_\varphi$, and
      a controlled inverse unitary operator circuit $U_\varphi^\dagger$;
   wherein the quantum computing device is configured to
      initialize the ancilla qubit in a $|+\rangle$ state and the input qubit in a $|\psi_0\rangle$ state of a plurality of eigenstates $|x\rangle$ to define a two-register state $|\Psi_0\rangle \equiv |+,\psi_0\rangle$;
      for each of a plurality K of iterations
         receive, using the input qubit, a respective one of the plurality of eigenstates $|x\rangle$ defining an input basis state,
         for odd iterations of the plurality K of iterations, act on the input basis state using the selective phase-flip unitary operator circuit $S_{\Psi_0}$ and the controlled unitary operator circuit $U_\varphi$, and
         for even iterations of the plurality K of iterations, act on the input basis state using the selective phase-flip unitary operator circuit $S_{\Psi_0}$ and the controlled inverse unitary operator circuit $U_\varphi^\dagger$.

9. The quantum computing device according to claim 8, further configured to measure, after the plurality K of iterations, the ancilla qubit in a 0/1 basis.

10. The quantum computing device according to claim 8, wherein the selective phase-flip unitary operator circuit $S_{\Psi_0}$ further comprises:
    a Hadamard transform H,
    a unitary operator $A_0$,
    a unitary operator I, and
    an inverse unitary operator $A_0^\dagger$;
    wherein the selective phase-flip unitary operator $S_{\Psi_0} = [H \otimes A_0][2|0,0\rangle\langle 0,0|-I][H \otimes A_0^\dagger]$.

11. The quantum computing device according to claim 8, further configured, for the ancilla qubit in a state $|0\rangle$, to act on the input qubit as $U_\varphi|0,x\rangle = e^{+i\varphi(x)}|0,x\rangle$, $U_\varphi|1,x\rangle = e^{-i\varphi(x)}|1,x\rangle$.

12. The quantum computing device according to claim 8, further configured, for the ancilla qubit in a state $|1\rangle$, to act on the input qubit as $U_\varphi^\dagger|0,x\rangle = e^{+i\varphi(x)}|0,x\rangle$, $U_\varphi^\dagger|1,x\rangle = e^{-i\varphi(x)}|1,x\rangle$.

13. The quantum computing device according to claim 8, further comprising a controlled estimation unitary operator circuit $U_{\varphi-\pi/2}$, and configured to:
    receive, using the input qubit, the $|\psi_0\rangle$ state defining an input random state; and
    act on the input random state using the controlled estimation unitary operator circuit $U_{\varphi-\pi/2}$.

14. The quantum computing device according to claim 13, wherein the controlled estimation unitary operator circuit $U_{\varphi-\pi/2}$ further comprises:
    the controlled unitary operator circuit $U_\varphi$,
    at least one bit-flip operator X, and
    at least one phase-shift operator $R_\varphi$;
    wherein the controlled estimation unitary operator circuit $U_{\varphi-\pi/2} = e^{-i\pi/2}|0\rangle\langle 0| \otimes U_\varphi + e^{i\pi/2}|1\rangle\langle 1| \otimes U_\varphi^\dagger$.

15. A system of quantum circuits for implementing an oracle U q for a non-boolean function φ, the system configured to:
- initialize an ancilla qubit in a $|+\rangle$ state and an input qubit in a $|\psi_0\rangle$ state of a plurality of eigenstates $|x\rangle$ to define a two-register state $|\Psi_0\rangle \equiv |+,\psi_0\rangle$;
- for each of a plurality K of iterations
  - receive, using the input qubit, a respective one of the plurality of eigenstates $|x\rangle$ defining an input basis state,
  - for odd iterations of the plurality K of iterations, act on the input basis state using a selective phase-flip unitary operator circuit $S_{\Psi_0}$ and a controlled unitary operator circuit $U_\varphi$, and
  - for even iterations of the plurality K of iterations, act on the input basis state using the selective phase-flip unitary operator circuit $S_{\Psi_0}$ and a controlled inverse unitary operator circuit $U_\varphi^\dagger$.

16. The system according to claim 15, further configured to measure, after the plurality K of iterations, the ancilla qubit in a 0/1 basis.

17. The system according to claim 15, wherein the selective phase-flip unitary operator circuit $S_{\Psi_0}$ further comprises:
- a Hadamard transform H,
- a unitary operator $A_0$,
- a unitary operator I, and
- an inverse unitary operator $A_0^\dagger$;
- wherein the selective phase-flip unitary operator $S_{\Psi_0} = [H \otimes A_0][2|0,0\rangle\langle 0,0| - I][H \otimes A_0^\dagger]$.

18. The system according to claim 15, further configured, for the ancilla qubit in a state $|0\rangle$, to act on the input qubit as $U_\varphi|0,x\rangle = e^{+i\varphi(x)}|0,x\rangle$, $U_\varphi|1,x\rangle = e^{-i\varphi(x)}|1,x\rangle$.

19. The system according to claim 15, further configured, for the ancilla qubit in a state $|1\rangle$, to act on the input qubit as $U_\varphi^\dagger|0,x\rangle = e^{+i\varphi(x)}|0,x\rangle$, $U_\varphi^\dagger|1,x\rangle = e^{-i\varphi(x)}|1,x\rangle$.

20. The system according to claim 15, further configured to:
- receive, using the input qubit, the $|\psi_0\rangle$ state defining an input random state; and
- act on the input random state using a controlled estimation unitary operator circuit $U_{\varphi-\pi/2}$ comprising:
  - the controlled unitary operator circuit $U_\varphi$,
  - at least one bit-flip operator X, and
  - at least one phase-shift operator $R_\varphi$;
  - wherein the controlled estimation unitary operator circuit $U_{\varphi-\pi/2} = e^{-i\pi/2}|0\rangle\langle 0| \otimes U_\varphi + e^{i\pi/2}|1\rangle\langle 1| \otimes U_\varphi^\dagger$.

* * * * *